United States Patent [19]
Abbott

[11] Patent Number: 6,150,836
[45] Date of Patent: Nov. 21, 2000

[54] MULTILEVEL LOGIC FIELD PROGRAMMABLE DEVICE

[75] Inventor: Curtis Abbott, Menlo Park, Calif.

[73] Assignee: Malleable Technologies, Inc., San Jose, Calif.

[21] Appl. No.: 09/346,556

[22] Filed: Jun. 30, 1999

Related U.S. Application Data

[63] Continuation-in-part of application No. 08/874,817, Jun. 13, 1997, Pat. No. 6,006,321.
[60] Provisional application No. 60/057,156, Aug. 28, 1997.

[51] Int. Cl.[7] .................................................. G06F 7/38
[52] U.S. Cl. .................................. 326/38; 326/52; 712/43
[58] Field of Search .................................. 326/38, 39, 37, 326/52, 59; 712/37, 43, 42, 33, 21, 227, 229

[56] References Cited

U.S. PATENT DOCUMENTS

| | | | |
|---|---|---|---|
| 3,980,992 | 9/1976 | Levy et al. | 340/172.5 |
| 4,558,411 | 12/1985 | Faber et al. | 364/200 |
| 4,791,602 | 12/1988 | Resnick | 364/900 |
| 4,791,603 | 12/1988 | Henry | 364/900 |
| 4,821,183 | 4/1989 | Hauris | 364/200 |
| 4,823,286 | 4/1989 | Lumelsky et al. | 364/521 |
| 4,992,680 | 2/1991 | Benedetti et al. | 307/465 |
| 5,055,712 | 10/1991 | Hawley et al. | 307/465 |
| 5,175,862 | 12/1992 | Phelps et al. | 395/800 |
| 5,185,706 | 2/1993 | Agrawal et al. | 364/489 |
| 5,220,213 | 6/1993 | Chan et al. | 307/465 |
| 5,231,588 | 7/1993 | Agrawal et al. | 364/489 |
| 5,250,859 | 10/1993 | Kaplinsky | 326/40 |
| 5,321,845 | 6/1994 | Sawase et al. | 395/800.37 |
| 5,619,668 | 4/1997 | Zaidi | 395/376 |
| 5,670,900 | 9/1997 | Worrell | 326/105 |

FOREIGN PATENT DOCUMENTS

WO/9857252  2/1998  WIPO.

OTHER PUBLICATIONS

International Search Report, Int'l Appln PCT/US98/11889, mailed Oct. 23, 1998, 5 pgs.

C.S. Wallace, "A Suggestion for a Fast Multiplier," IEEE Transaction son Electronic Computers, Feb. 1964, pp. 14–17.

Charles R. Baugh and Bruce A. Wooley, "A Two's Complement Parallel Array Multiplication Algorithm," IEEE Transactions on Computers, vol. C–22, No. 12, Dec. 1973, pp. 1045–1047.

Earl E. Swartzlander, Jr. "Merged Arithmetic," IEEE Transactions on Computers, vol. C–5, No. 10, Oct. 1980, pp. 946–950.

Michael Bolotski, Andre DeHon, and Thomas F. Knight, Jr., Transit Note #95 *Unifying FPGAs and SIMD Arrays*, MIT Transit Project, Sep. 1993, 14 pps.

(List continued on next page.)

*Primary Examiner*—Tan T. Nguyen
*Attorney, Agent, or Firm*—Blakely, Sokoloff, Taylor & Zafman

[57] ABSTRACT

A method and apparatus for providing a programmable logic datapath that may be used in a field programmable device. According to one aspect of the invention, a programmable logic datapath is provided that includes a plurality of logic elements to perform various (Boolean) logic operations. The programmable logic datapath further includes circuitry to selectively route and select operand bits between the plurality of logic elements (operand bits is used hereinafter to refer to input bits, logic operation result bits, etc., that may be generated within the logic datapath). In one embodiment, by providing control bits concurrently with operand bits to routing and selection (e.g., multiplexing) circuitry, the programmable logic datapath of the invention can provide dynamic programmability to perform a number of logic operations on inputs of various lengths on a cycle-by-cycle basis.

51 Claims, 16 Drawing Sheets

OTHER PUBLICATIONS

Debabrata Ghosh, et al., "Architectural Synthesis of Performance–Driven Multipliers with accumulator Interleaving," 30th ACM/IEEE Design Automation Conference, (1993) pp. 303–307.

Andre DeHon, Transit Note #118 Notes on Coupling Processors with Reconfigurable Logic, MIT, pp. 1–40.

Andre DeHon, Reconfigurable Architectures for General–Purpose Computing, 258 pps.

PCT Written Opinion, Int'l Appln PCT/US98/11889, mailed Jun. 01, 1999, 6 pps.

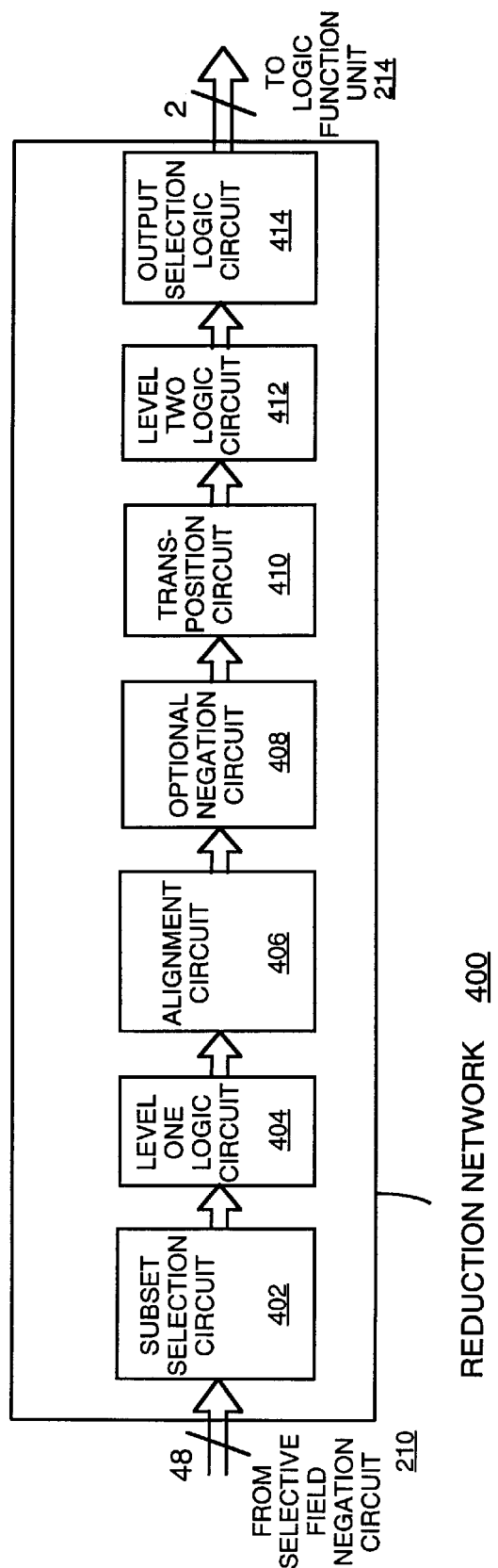

MULTILEVEL LOGIC FIELD PROGRAMMABLE DEVICE

CROSS-REFERENCE TO RELATED APPLICATIONS

This is a continuation-in-part of non-provisional application Ser. No. 08/874,817, filed Jun. 13, 1997, now U.S. Pat. No. 6,006,321 entitled "PROGRAMMABLE LOGIC DATAPATH THAT MAY BE USED IN A FIELD PROGRAMMABLE DEVICE," to Curtis Abbott.

This application is contains subject matter related to non-provisional application Ser. No. 08/953,766, filed Oct. 17, 1997, entitled "A RECONFIGURABLE ARITHMETIC DATAPATH," to Curtis Abbott, which is a continuation of provisional application No. 60/057,156, filed Aug. 28, 1997.

BACKGROUND OF THE INVENTION

1. Field of the Invention

The invention relates to the field of logic devices. More specifically, the invention relates to the field of programmable logic devices.

2. Background Information

One of the core functional units of a computer processor (or CPU) is the arithmetic/logic datapath, or simply, the datapath. The datapath is typically responsible for executing various arithmetic and/or logic operations supported by the instruction set architecture (ISA) of a computer system. As such, the datapath typically includes an arithmetic logic unit (ALU) that performs arithmetic/logic operations, an address generation unit to provide memory addresses, and a control unit to provide the proper control signals for the various devices of the datapath to perform the desired operation(s).

The control signals that control the operations of the datapath may be considered as a vector of bits, which is known as a "direct control vector", since it directly controls the datapath operations. The width of this direct control vector varies greatly in CPU designs, and both the overall width as well as the meaning of the individual control bits is dependent on detailed aspects of the design. However, for typical CPU designs, the width of the direct control vector is from about 50 to 150 bits. Typically, the direct control vector is developed from a combination of bits in the instruction, processor state bits (which are sometimes known as "mode bits"), and logic gates. The combination of instruction bits and mode bits, all of which may change on each cycle, can be considered as an "indirect control vector" since it indirectly controls the datapath operations. The indirect control vector is normally much less wide than the direct control vector, about 10 to 30 bits in a typical CPU design. For example, when an ADD instruction is issued in a CPU, an opcode (the indirect control vector) that is contained in the ADD instruction is decoded by the control mechanism to generate appropriate control signals (the direct control vector) to cause the ALU to add the two operands indicated by the ADD instruction. In a similar manner, other relatively simple arithmetic and/or (Boolean) logic operations may be realized by the datapath of the CPU.

Several aspects of a CPU's datapath may be limited by various device and/or design constraints. For example, operands in a CPU datapath are typically limited to those of fixed length to simplify the datapath and control mechanisms of the datapath, which in turn, may result in improved system performance/efficiency. Similarly, some CPU designs, such as those implemented in reduced instruction set architecture (RISC) processors, increase performance by limiting the complexity and number of types of operations supported by the datapath to minimize control signals, minimize/simplify the number of datapath components, etc.

A CPU's ISA cannot create more direct control vectors than $2^X$, where X is the width in bits of the indirect control vectors. This is because every possible direct control vector corresponds to a distinct indirect control vector, so even though there may be more bits in the direct control vector, the number of states reachable by the datapath is determined by the indirect control vector. For this reason, a CPU design cannot specify in a single instruction all the complex logic operations that may be necessary for some applications. Instead, complex logic operations are broken down into a sequence of simpler ones. In this way, a CPU may perform an arbitrarily complex logic operation, but it may take many instruction cycles to complete.

Some applications require relatively complex logic operations to be performed at high speed. For example, an application might require a certain complex logic operation to be performed 1 million times per second. For a CPU to perform these operations in time, it must be able to process instructions at a still higher rate. For example, if an operation required 800 instructions on a certain CPU, it would have to process 800 million instructions per second to meet the requirements of the application. In many cases, this is not an economical way to implement demanding applications, while in others it is not possible at all. In such cases, other devices may be used in place of or in combination with a CPU's ALU. For example, programmable logic arrays (PLAs), field programmable gate arrays (FPGAs), and application specific integrated circuits (ASICs) may be tightly coupled to serve as coprocessors to a CPU. The coprocessor elements, whether ASICs, PLAs, or FPGAs, are configured to perform the complex logic operations required by the application in a much more parallel manner than a CPU, so that the operations can be done at a lower, and more economical, clock rate.

While ASICs are specifically designed state machines and datapaths, PLAs and FPGAs typically contain an array/matrix of logic circuits (e.g., logic gates, memory cells, etc.) in which connections between particular logic circuits may be programmed after manufacture (e.g., by a user in the field; hence, the term "field" programmable). As such, PLAs and FPGAs may be configured to perform relatively complex logic operations by making the proper pattern of interconnections (e.g., by burning in fuses or programming individual SRAM cells) in the logic array of such devices. Often, this is analogous to defining a single, highly specialized CPU instruction specifically for the application, or in more complex cases a better analogy might be to defining a highly specialized datapath that implements several specialized instructions using its own direct and indirect control vectors, which may be supplied by the CPU.

However, PLAs, FPGAs and ASICs suffer from some limitations. For example, ASICs cannot be reprogrammed. As another example, certain PLAs and FPGAs cannot be reprogrammed once configured and installed (often referred to as "one-time programmable"). Thus, such devices may not be suitable for applications wherein the execution of various logic operations may be required. Furthermore, a substantial portion of circuitry in PLAs and FPGAs may be unused, resulting in power and/or cost inefficiency.

Although some FPGAs may be re-programmed to support various logic operations and numbers of inputs, such devices also suffer from limitations. For example, in an SRAM cell-based FPGA, the interconnection array in which the various configurable logic blocks (CLBs) reside is typically programmed by pass transistors, which may result in relatively large "on" resistance. Furthermore, interconnect delays in SRAM cell-based FPGAs may be relatively large due to certain wires of unpredictably varying, and sometimes relatively long, length. Yet further inefficiency may be caused by the presence of multiple wires in the interconnect array which may be unused, resulting in increased capacitive load and increased device driver power requirements; and by the need for multiple pass transistors and SRAM cells to complete each logical connection. Finally, the number of control/configuration bits typically required to program an FPGA (e.g., produce the appropriate interconnections between the CLBs) may exceed 250,000 bits, making dynamic (e.g., "on the fly"; on a cycle-by-cycle basis) re-configuration/re-programming relatively difficult and commercially impractical.

SUMMARY OF THE INVENTION

A method and apparatus for providing a programmable logic datapath that may be used in a field programmable device is described. According to one aspect of the invention, a programmable logic datapath is provided that includes a plurality of logic elements to perform various (Boolean) logic operations from operand bits that may be furnished from operand register banks, inputs to the field programmable device, results of previous operations, and so forth. The programmable logic datapath further includes circuitry to dynamically select, route and combine operand bits between the plurality of logic elements. In one embodiment, by providing control bits concurrently with operand bits to selecting, routing and combining circuitry, the programmable logic datapath of the invention can provide dynamic programmability on a cycle-by-cycle basis to perform a number of logic operations on inputs of various lengths and outputs.

According to another aspect of the invention, a field programmable device containing the programmable logic datapath, as well as additional circuitry for operating the programmable logic datapath, is provided. In one embodiment, the field programmable device includes circuitry for decoding indirect control vectors into direct control vectors that specify the operation(s) to be performed by the programmable logic datapath on a cycle by cycle basis.

According to another aspect of the invention, a field programmable device containing the programmable logic datapath contains additional datapath circuitry specialized for performing arithmetic operations.

According to a still further aspect of the invention, one or more field programmable devices containing some or all of these elements may be integrated onto a single semiconductor chip together with other system elements, including CPUs, specialized I/O circuits, FPGA circuits, and so on.

The programmable logic datapath overcomes many limitations of the prior art. Although a useful embodiment of it will require a much wider direct control vector than a CPU datapath, the programmable logic datapath can perform many complex logic operations in a single cycle that are well beyond the capability of a CPU datapath. Thus, for certain applications, it is more comparable to an ASIC or FPGA. However, the ASIC is not field programmable. Compared to an FPGA, the programmable logic datapath will require significantly fewer control bits for a given complexity of logic operations. Partly for this reason, it becomes practical to change the direct control vector on every cycle, which increases flexibility. Finally, because the programmable logic datapath uses predefined connections, with selecting and routing performed by multiplexers, the speed of interconnection paths is increased while the unpredictability of this speed is greatly decreased.

BRIEF DESCRIPTION OF THE DRAWINGS

FIG. 4 is a block diagram illustrating a reduction network in the programmable logic datapath according to one embodiment of the invention;

DETAILED DESCRIPTION

In the following description, numerous specific details are set forth to provide a thorough understanding of the invention. However, it is understood that the invention may be practiced without these specific details. In other instances, well-known circuits, structures and techniques have not been shown in detail to avoid obscuring the invention.

An Embodiment of the Field Programmable Device

Figure 1:
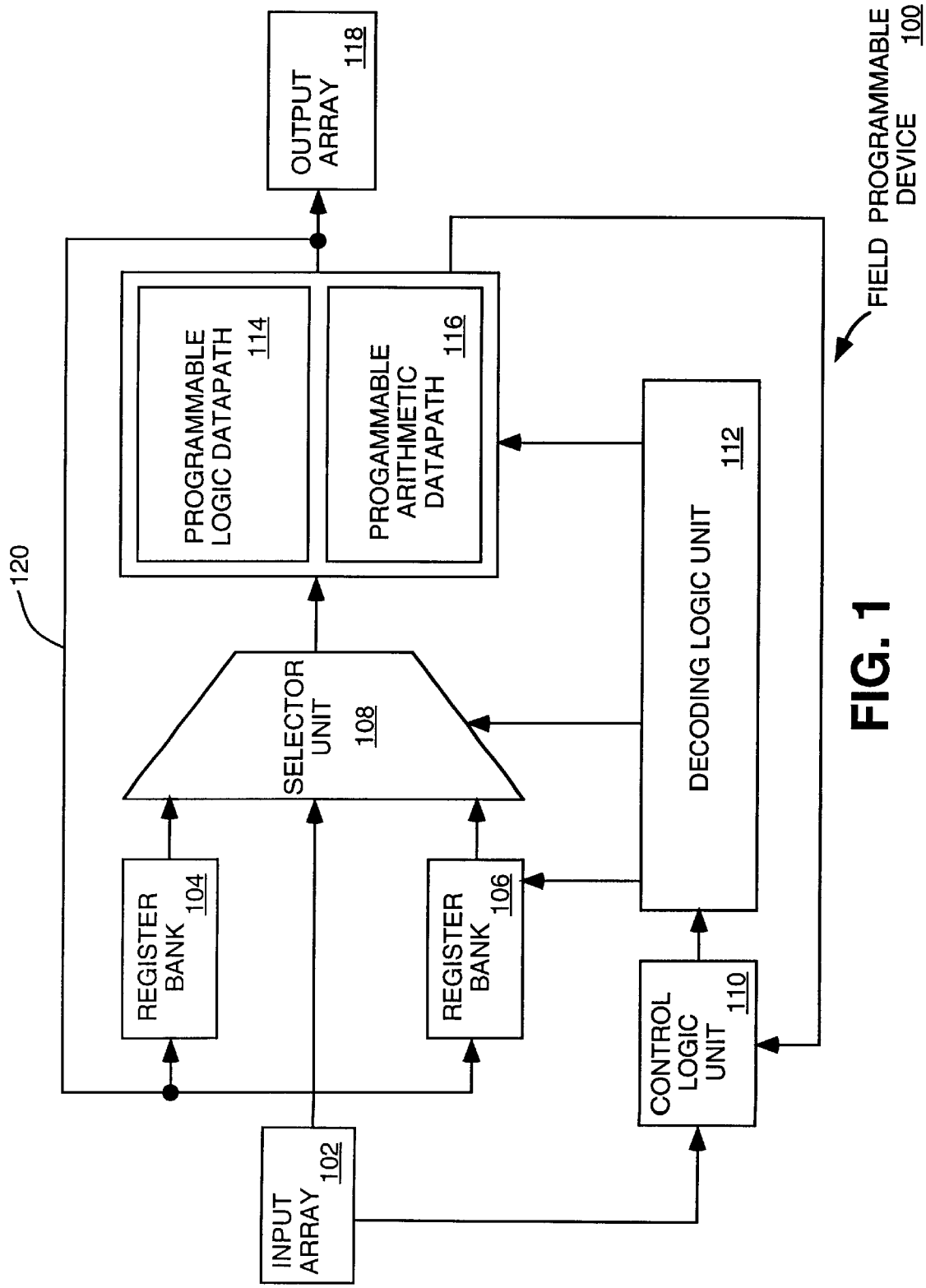
FIG. 1 is a block diagram illustrating a field programmable device according to one embodiment of the invention.

FIG. 1 is a block diagram illustrating a field programmable device according to one embodiment of the invention. In FIG. 1, a field programmable device 100 is shown which includes an input array 102 and an output array 118. The input array 102 represents one or more bits that are input to the field programmable device 100. Similarly, the output array 118 represents one or more bits that are output by the field programmable device 100. In one embodiment, the input array 102 and/or the output array 118 may represent registered/latched input and output bits, respectively.

The input array 102, a register bank 104, and a register bank 106 are shown coupled to a selector unit 108. The register banks 104 and 106 each represents a set of one or more registers/latches for storing data (or a subset thereof): 1) input into the input array 102; and/or 2) output by the datapath(s) provided via a feedback path 120. Thus, the register bank 104 and/or 106 may represent or include an accumulator, as will become further apparent from the description that follows. In one embodiment, the register banks 104 and 106 are 32-bits wide and 256 bits deep, and are dual ported for read operations and single ported for write operations. In alternative embodiments, more or fewer register banks may be used having various port and storage capacity configurations. For example, one embodiment has no register banks, but stores inputs and/or results needed for subsequent datapath operations in registers contained in the datapath. Another embodiment does not include any mechanism (e.g., register banks) to store inputs and/or outputs for use in subsequent datapath operations.

The selector unit 108 is shown coupled to provide input from the register bank 104, the register bank 106, and/or the input array 102 to a programmable logic datapath 114 and/or a programmable arithmetic datapath 116. The programmable logic datapath 114 and the programmable arithmetic datapath 116 are both further coupled to provide the output data to the output array 118. The programmable logic datapath 114 and the programmable arithmetic datapath 116 are configured to perform (Boolean) logic operations and arithmetic (e.g., add, multiply, divide, etc.) operations, respectively.

In FIG. 1, the input array 102 is further coupled to a control logic unit 10, which in turn is coupled to a decoding logic unit 112. In one embodiment, the control logic unit 110 provides an indirect control vector (ICV) to the decoding logic unit 112. While any number of ICVs may be stored in the control logic unit 110, in one embodiment of the invention the control logic unit 110 stores 128 ICVs, each 102 bits in length and consisting of several sub-fields of differing lengths. Some of these sub-fields are used directly to control parts of the field programmable device 100, and are therefore called "direct ICV sub-fields". Other of these sub-fields are further decoded by the decoding logic unit 112, to select other parts of a direct control vector (DCV) to program/configure various portions of the field programmable device 100. These sub-fields are called "indirect ICV sub-fields".

The DCV is selected from as many memories as there are indirect ICV sub-fields. Each memory is of an appropriate width to control those parts of the field programmable device 100 to which it is dedicated, and has a depth, or number of elements, equal to $2^X$ where X is the length of the indirect ICV sub-field that addresses that memory. These DCV memories may be of any type, including one or more of DRAM, SRAM, ROM, etc. While one embodiment is described which uses subfields and separate memories, alternative embodiments could use most or all of the ICV to address a single memory.

In one embodiment, the decoding logic unit stores 16 DCVs for the subset selection portion (described later herein) of the programmable logic datapath 114 in a random access memory (RAM) and 16 DCVs in a ROM. The memory width needed to control this portion of the programmable logic datapath in this embodiment is 1536 bits, while the length of the indirect ICV sub-field that addresses this memory is 5 bits. Other memories control other portions of the selected DCV, applying them as control signals to the selector unit 108, the register bank 106, the register bank 104, other parts of the programmable logic datapath 114, and/or the programmable arithmetic datapath 116. In one embodiment, the total DCV length when all the fields are accounted for is 2669 bits.

In one embodiment, the field programmable device includes 72 input pins and 72 output pins. Of the 72 input pins, 64 are used for data and 8 are used as interrupt pins directly coupled to the control logic unit 110. Of the 72 output pins, 64 are used for data and 8 are used as output control pins that are set by dedicated control fields within the field programmable device.

In one embodiment, the indirect control vectors are selected by the control logic unit 110 from multiple conceptually distinct "threads" of control, using parallel hardware to perform the "thread switching" on a cycle-by-cycle basis. Distinct portions of the register bank 104 and/or the register bank 106 may be used by different threads to avoid thread switching overhead. In an alternative embodiment, the control logic unit 110 is not present and the decoding logic unit 112 is operatively coupled to receive the indirect control vectors from the input array 102 (e.g., an opcode contained in an instruction provided by a microprocessor that may be coupled to the field programmable device 100). In yet another alternative embodiment, rather than decoding, a serially programmable 1-deep memory is included to provide the control signals.

Thus, in one embodiment further described herein, by providing approximately 2,500 control bits concurrently with up to 64 operand bits to selecting, routing and combining circuitry, the programmable logic datapath of the invention can provide dynamic programmability on a cycle-by-cycle basis to perform a number of logic operations on inputs of various lengths and provide up to 64 outputs. While an embodiment is described with reference to a specific number of inputs, outputs and control bits, alternative embodiments can have more or fewer inputs, outputs and/or control bits.

An Embodiment of the Logic Datapath

Figure 2:
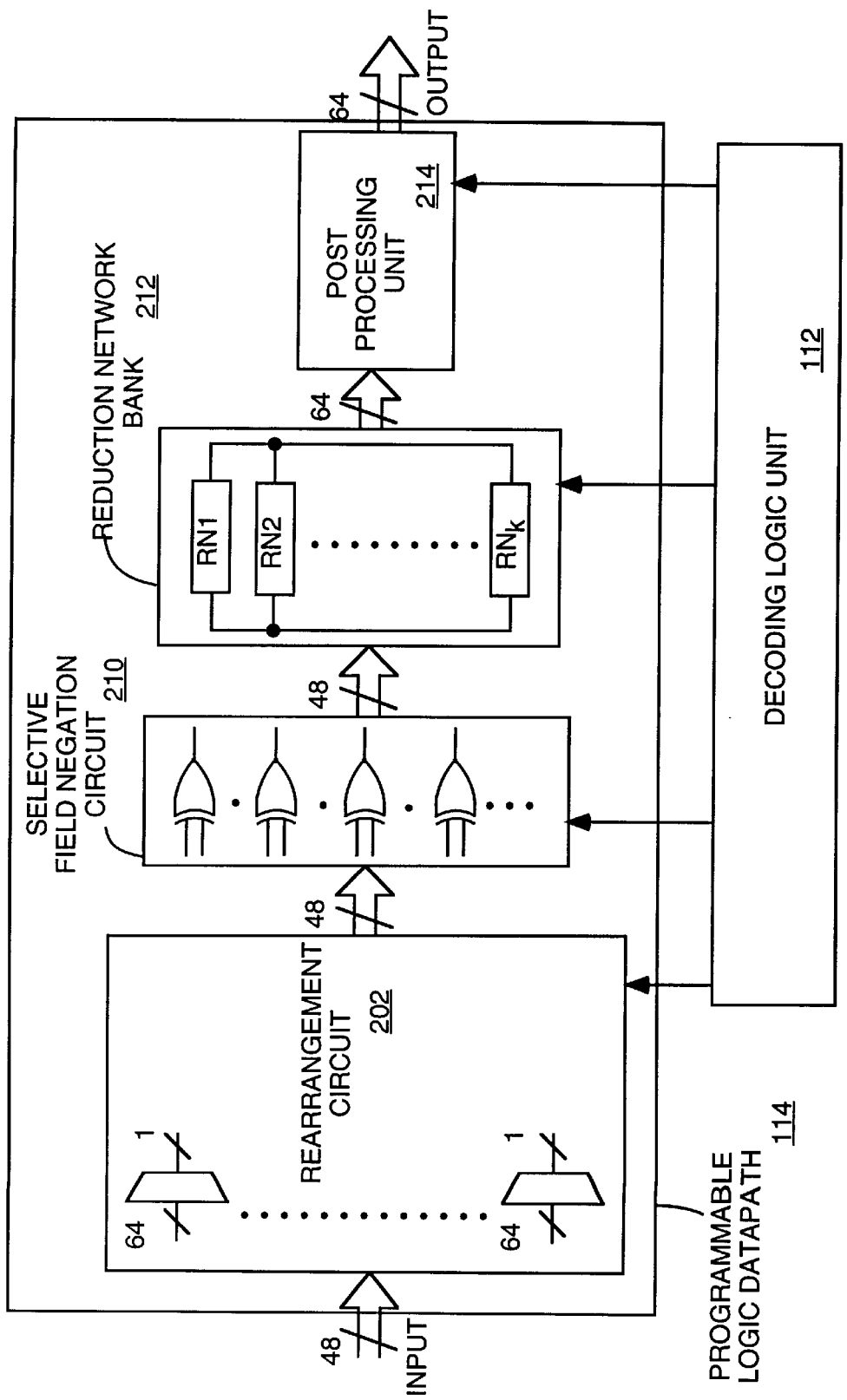
FIG. 2 is a more detailed block diagram of the programmable logic datapath section of the field programmable device according to one embodiment of the invention.

Referring to FIG. 2, a more detailed block diagram of the programmable logic datapath section of an field programmable device 100 according to one embodiment of the invention is shown. In FIG. 2, the programmable logic datapath 114 of FIG. 1 is shown coupled to the decoding logic unit 112. As described with reference to FIG. 1, the decoding logic unit 112 provides control bits for the various circuits of the field programmable device 100.

Rearrangement

As shown in FIG. 2, the programmable logic datapath includes a rearrangement circuit 202 configured to allow for flexible rearrangement and duplication of the input data bits. While any number of input bits may be used, the embodiment shown receives 48 input bits, which are either the upper 48 or lower 48 of the 64 bits formed by the concatenation of two 32-bit register bank outputs. The set of input bits may include data bits for a current cycle of operation and/or accumulated bits (e.g., output bits from a previous cycle of a logic and/or arithmetic operation).

The number of bits output by the rearrangement circuit 202 is a design choice. Thus, while one embodiment is described that outputs the same number of bits as are input, alternative embodiments can output more or fewer bits than are input. (If more bits are output than input, by necessity some input bits will be duplicated in the output.)

In one embodiment that receives 48 input bits and provides 48 outputs, the rearrangement circuit 202 comprises a set of forty-eight 48-to-1 multiplexing circuits (each coupled to receive the 48 input bits) for selectively routing any of the 48 input bits to its output. To control the forty-eight multiplexing circuits, each multiplexing circuit receives a different set of six control/configuration bits from the decoding logic unit 112 (making a total of 288 control bits). Thus, the 48 multiplexing circuits operate to dynamically select and/or rearrange (i.e., modify relative bit positions) the input bits.

Figure 3B:
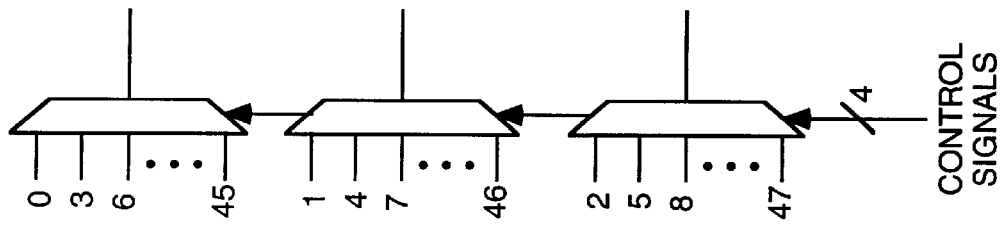
FIG. 3B is a block diagram illustrating one group of three multiplexers that selectively provides one of the three bit fields according to one embodiment of the invention.
Figure 3A:
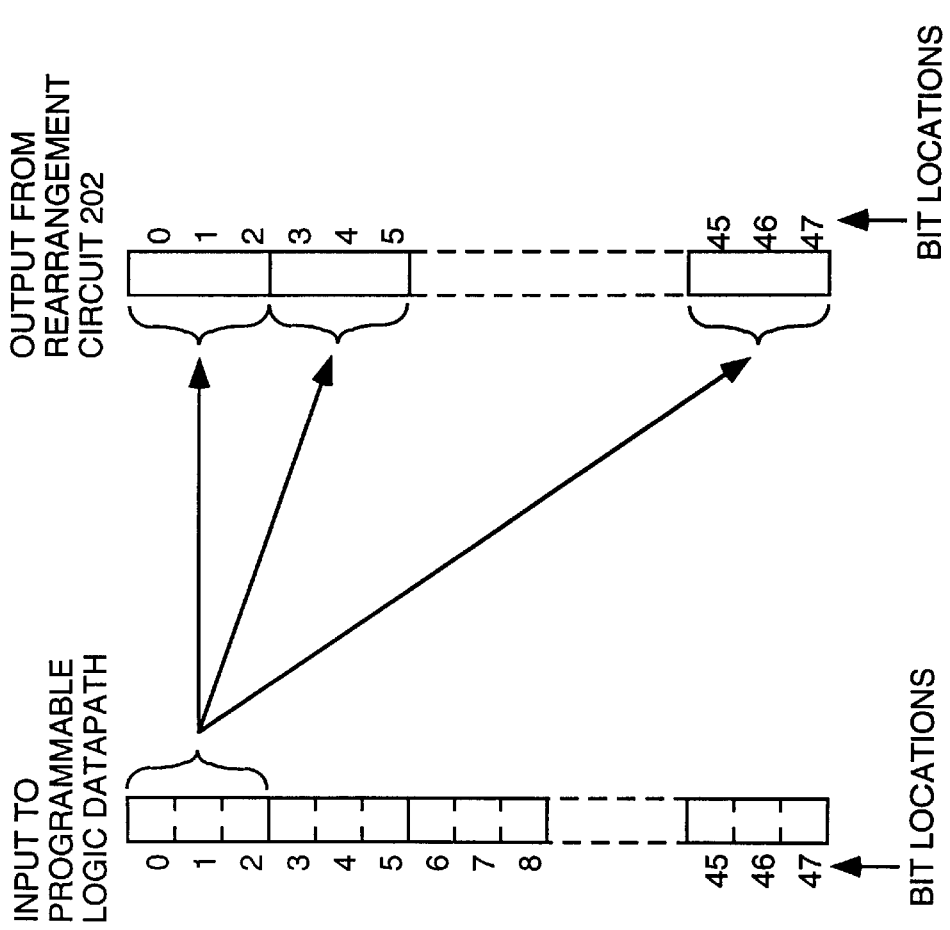
FIG. 3A is a block diagram illustrating the rearrangements of three bit fields according to one embodiment of the invention.

In alternative embodiments, the bits input to the rearrangement circuit 202 may be selectively routed to the outputs in fixed sized, non-overlapping fields of multiple, consecutive bits. For example, one such embodiment selectively routes 48 inputs to 48 outputs using 3-bit fields as shown in FIG. 3A. This embodiment can be implemented using forty-eight 16-to-1 multiplexers, where the forty-eight 16-to-1 multiplexers are grouped in sets of 3 to create 16 groups of 3 multiplexers. FIG. 3B is a block diagram illustrating one group of 3 multiplexers used to route one 3-bit field according to one embodiment of the invention. Each group of multiplexers receives a different set of 4 control bits provided by the decoding logic unit 112 (the multiplexers in each group each receive the same 4 control bits).

In general, given J input bits, L output bits, and a rearrangement field size of F bits (where J/F is an integer), the rearrangement circuit 202 can include L J/F-to-1 multiplexing circuits, each controlled by X control signals, where X is the least power of 2 greater than or equal to J/F, and such that consecutive groups of F multiplexing circuits are controlled by the same X control signals. To illustrate, in the embodiment described above that uses forty-eight 48-to-1 multiplexers, J=48, L=48, F=1, and X=6; while, in the embodiment described above that uses forty-eight 16-to-1 multiplexers, J=48, L=48, F=3, and X=4. While two embodiments of the rearrangement circuit 202 have been described, it should be understood that the rearrangement circuit 202 could be adapted for various input and rearrangement bit field widths.

Selective Field Negation

As shown in the embodiment illustrated in FIG. 2, the rearrangement circuit 202 is followed by a selective field negation circuit 210. The selective field negation circuit 210 selectively negates certain bits output by the rearrangement circuit 202 based on control bits provided by the decoding logic unit 112. In one embodiment, the selective field negation circuit 210 includes one or more logic elements that are configured to selectively negate alternating fields output by the rearrangement circuit 202. The field width used for the selective field negation circuit may be unrelated to that used by the rearrangement circuit. As shown in FIG. 2, the selective field negation circuit 210 includes a series of exclusive-OR (XOR) gates positioned to accept some of the bits output by the rearrangement circuit 202. In one embodiment, the field width for the selective field negation circuit is 3, which means that alternating groups of 3 bits output by the rearrangement circuit 202 are either wired straight through or input to an XOR gate. By supplying a control bit from the decoding logic unit to the other input of each of the XOR gates, the selective field negation circuit 210 provides for the selective negation of every other field output by the rearrangement circuit 202. The number of distinct control bits may be varied according to the degree of general purpose control required. In one embodiment, a different control bit is used for each field of 3 XOR gates, so that the total number of control bits is 8 (since there are sixteen 3-bit fields from 48 bits and half of them are wired straight through). In another embodiment, one bit fields are used wherein every other output of the rearrangement circuit is coupled as an input to an XOR gate, and there are a total of 24 control bits used.

By using a multi-input negation element (e.g., an XOR gate) and by allowing input of an appropriate control input to the negation element, negation of (alternating) rearranged fields may be performed in a controlled/selective manner. As such, subsequent stages of the programmable logic datapath 114 described below can implement logic operations upon mostly positive and/or negative terms, a relatively balanced combination of positive and negative terms, and/or via logical equivalencies as provided by DeMorgan's Law over mostly positive or negative terms.

While one embodiment has been described that selectively rearranges according to predetermined bit fields and selectively negates alternating bit fields, alternative embodiments of the invention may not rearrange input bits and/or not include a selective field negation circuit. Furthermore, in alternative embodiments, input bit field rearrangement and/or negation may be performed according to several methods other than the ones described above. For example, selective negation may be performed using logic elements other than XOR gates (e.g., inverters and multiplexers).

Reduction Network Bank

Referring again to FIG. 2, the negated and/or non-negated results of the rearrangement circuit 202 (having a total width of 48 bits in one embodiment) are provided to a reduction network bank 212. The reduction network bank 212 comprises a set of (k) reduction networks shown in FIG. 2 as the elements $RN_1$ through $RN_k$. The number of reduction networks is a design choice. In one embodiment, each of 32 reduction networks in the reduction network bank 212 receives the negated and/or non-negated outputs from the rearrangement circuit 202 and generates a two bit result. The structure and operation of a reduction network according to one embodiment of the invention will be described in further detail below with reference to FIGS. 5A–5F.

Post Processing

The reduction network bank 212, upon performing various bit routing, bit selection, and/or logic operations, outputs 64 bits to a post processing unit 214. The post processing unit 214 may be configured to perform various functions upon the output of the reduction network bank 212. For example, in one embodiment, the post processing unit 214 may be configured to detect the number and/or positions of (e.g., zeros and/or ones) in various fields of the output bits of the reduction network bank 212. Several exemplary functions that may be performed by post processing unit 214 and/or the reduction network bank 212 are described below.

In alternative embodiments, the post processing unit 214 may not be included in the programmable logic datapath 114. For example, in one embodiment, a device (e.g., a processor) coupled to the programmable logic datapath of the present invention obtains the output/result generated by the programmable logic datapath and performs a "post processing" function. In another embodiment, post processing functions are not performed.

An Embodiment of a Reduction Network in the Reduction Network Bank

FIG. 4 is a block diagram illustrating one reduction network 400 in the reduction network bank 212 according to one embodiment of the invention. The reduction network 400 includes a subset selection circuit 402. In the embodiment in which the rearrangement circuit provides 48 outputs, the subset selection circuit 402 is configured to receive the 48 outputs from the rearrangement circuit 202 and/or the selective field negation circuit 210. The subset selection circuit 402 provides outputs to a level one logic circuit 404.

Subset Selection

Figure 5A:
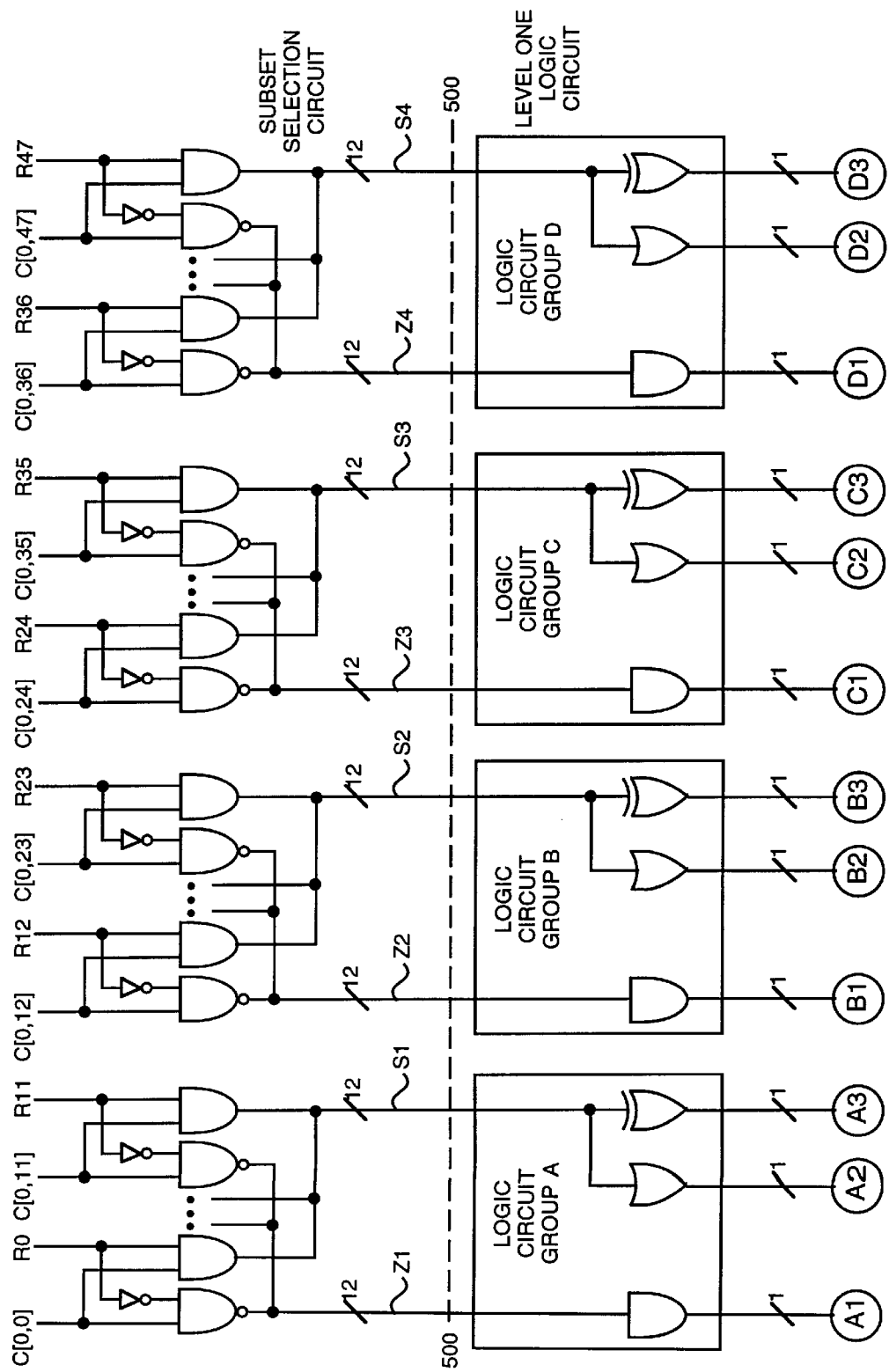
FIG. 5A is a schematic diagram illustrating the subset selection circuit 402 and the level one logic circuit 404 of FIG. 4 according to one embodiment of the invention.

FIG. 5A is a schematic diagram illustrating the subset selection circuit 402 and the level one logic circuit 404 of FIG. 4 according to one embodiment of the invention. In FIG. 5A, the circuitry above and below the dashed line 500 is respectively part of the subset selection circuit 402 and the level one logic circuit 404.

In FIG. 5A, an embodiment of the subset selection circuit 402 that includes four groups of NAND and AND gates is shown, wherein each of the four groups includes twelve pairs of NAND and AND gates. Each AND gate is coupled to receive a control bit $C[i,j]$ and an input bit $R_n$, where i indicates one of the 32 reduction networks 0–31, j represents one of the 48 gate control bits 0–47, and Rn represents one of the bits 0–47 input to the reduction network. Each NAND gate receives the same inputs as the AND gate to which it is paired, except the Rn input to the NAND gate is negated.

By gating the 48 bits with a control bit, a subset of the input bits can be selected (e.g., when the control bit is a logical "1", the input bit will be contained in a subset). The result generated by the 48 NAND gates of the subset selection circuit 402 is shown in FIG. 5A as four twelve-bit output lines Z1–Z4. Similarly, the result of the 48 AND gates is shown as four twelve-bit output lines S1–S4. It should be understood, however, that each of the four lines S1–S4 and Z1–Z4 represents twelve logically/electrically distinct bits.

While one embodiment has been described wherein subset selection is implemented with a series of NAND and AND gate pairs, alternative embodiments may use several other types and/or combinations of logic elements (e.g., NAND gates, NOR gates, MUXes, etc.) to perform subset selection. For example, commonly available logic synthesis tools, such as Design Compiler® from Synopsys®, Inc., might be applied to a design description of the subset selection to create the logically equivalent configuration of gate elements that is optimal for a given VLSI design environment. Furthermore, alternative embodiments of the reduction network 400 may not include a subset selection circuit.

Level One Logic

The result generated by the subset selection circuit 402, and in particular, the twelve-bit output lines Z1–Z4 and S1–S4, are shown coupled to four groups of logic circuits A–D, wherein each group includes an AND, OR, and XOR logic network. The four output lines Z1–Z4 are respectively coupled to the AND logic of logic groups A–D, while the four output lines S1–S4 are respectively coupled to both the OR and XOR logic of logic groups A–D. Although each of the four groups of logic circuits A–D is conceptually shown to include three 12-input logic elements, in practice, it should be understood that such elements typically have fan-in limitations that may limit the number of inputs. Accordingly, in one implementation, each group of the logic circuits A–D may contain twelve 2-input AND gates, twelve 2-input OR gates, and twelve 2-input XOR gates. However, it should be understood that several other combinations of input-type (e.g., 2-input, 4-input, 8-input) and/or logic type (e.g., NAND, NOR, NOT, etc.) of logic elements may be utilized in alternative embodiments of the level one logic circuit 404. While one embodiment is shown having three different logic functions in each logic circuit group A–D, alternative embodiment may support more, less, and/or different logic functions.

As shown in FIG. 5A, each of the four logic circuit groups A–D generates three one-bit outputs. For example, the logic circuit group A is shown to generate an AND output bit A1, an OR output bit A2, and an XOR output bit A3. Similarly, the logic circuit groups B, C, and D are shown to generate three output bits B1–B3, C1–C3, and D1–D3, respectively.

While one embodiment is shown in which static logic is used in the logic levels, alternative embodiment replace certain or all of the static logic with logic blocks (e.g., SRAMs).

Alignment

Referring back to FIG. 4, the level one logic circuit 404 is shown further coupled to an alignment circuit 406. The alignment circuit 406, according to one embodiment of the invention, is described with reference to FIGS. 5B and 5C.

Figure 5B:
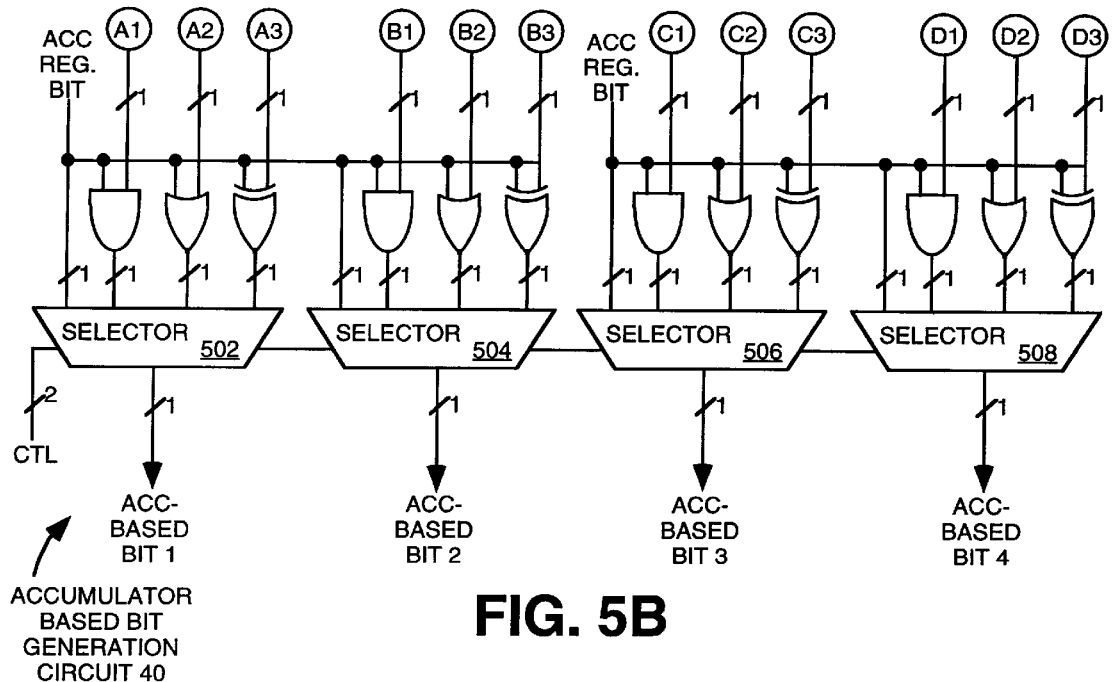
FIG. 5B is a schematic diagram illustrating an accumulator-based bit generation circuit 40 located in the alignment circuit 406 of FIG. 4 according to one embodiment of the invention.
Figure 5C:
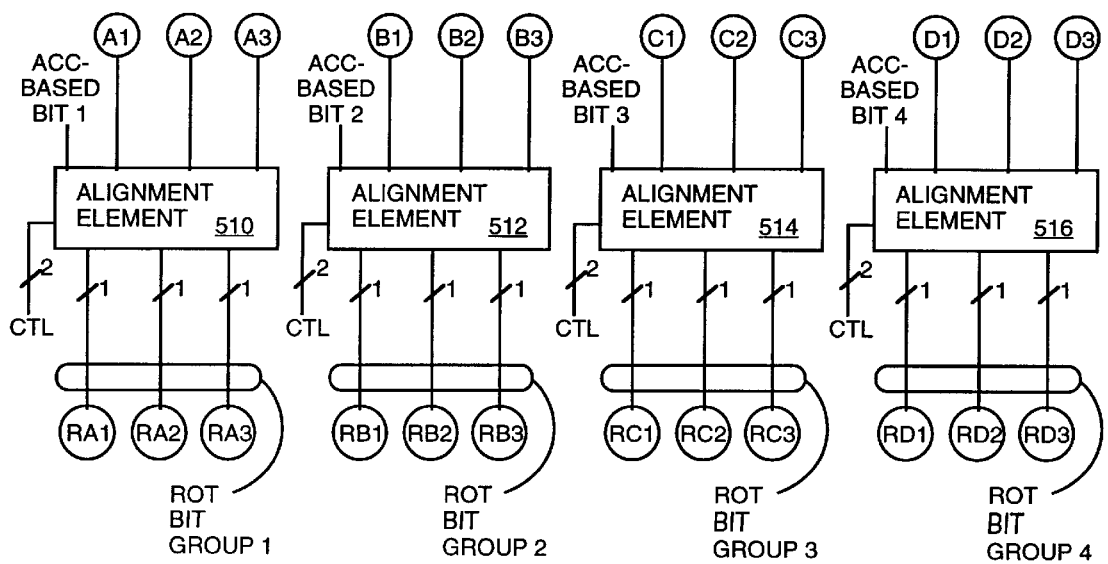
FIG. 5C is a schematic diagram illustrating the remainder of the alignment circuit 406 of FIG. 4 according to one embodiment of the invention.

In one embodiment of the invention, the alignment circuit 406 is configured to receive the output bits A1–D3 of the level one logic circuit 404, as well as a set of accumulator-based bits, as shown in FIG. 5C. FIG. 5B will now be described to illustrate the generation of the accumulator-based bits, according to one embodiment of the invention.

Accumulator

FIG. 5B is a schematic diagram illustrating an accumulator-based bit generation circuit 40 located in the alignment circuit 406 of FIG. 4 according to one embodiment of the invention. As shown in FIG. 5B, the accumulator-based bit generation circuit 40 includes a set of selectors 502, 504, 506, and 508. Each selector is coupled to receive an accumulator register bit, depicted as ACC REG BIT. The ACC REG BITs constitute an additional input to the programmable logic datapath component of the field programmable device, which may represent a stored result of one or more logic and/or arithmetic operations previously performed by the field programmable device 100 of FIG. 1, or could alternatively be furnished as an additional output of selector unit 108. In one embodiment, there are 64 ACC REG BITs stored within the programmable logic datapath, two for each reduction network 400 of FIG. 4, with one bit associated with selectors 502 and 504 and the other associated with selectors 506 and 508. In addition to the appropriate ACC REG BIT, each selector receives the result of gating the ACC REG BIT with one of the output bits A1–D3 of level one logic circuit 404 (e.g., through an AND, OR, and XOR logic circuit, as depicted in FIG. 5B). In particular, since the output bit A1 was generated by an AND operation, the output bit A1 and the appropriate ACC REG BIT are provided as inputs to an AND gate. In this manner, the result of a previous operation (ACC REG BITs) can be logically combined with the current input.

While one embodiment is shown in which each of the selectors 502, 504, 506, and 508 receives the same two control bits, in an alternative embodiment of the invention each selector receives a different set of control bits. The control bits provided to each selector facilitates selection of one of the inputs of that selector, such as the ACC REG BIT or the gated result of the ACC REG BIT and another bit (e.g., one of the output bits A1–D3 of the level one logic circuit 404 described with reference to FIG. 5A). Accordingly, the selectors 502, 504, 506, and 508 output a selected one of an ACC-BASED BIT 1, ACC-BASED BIT 2, ACC-BASED BIT 3, and ACC-BASED BIT 4, respectively.

It should be appreciated that alternative embodiments may use several types and combinations of logic elements to gate the ACC REG BIT, or may not gate the ACC REG BIT. Furthermore, alternative embodiments of the invention may not include an accumulator-based bit generation circuit and/or utilize an accumulator result.

Alignment Elements

FIG. 5C is a schematic diagram illustrating the remainder of the alignment circuit 406 of FIG. 4 according to one embodiment of the invention. In FIG. 5C, a set of four alignment elements 510, 512, 514, and 516 are shown. Each of the alignment elements 510, 512, 514, and 516 is coupled to receive an ACC-BASED BIT and three output bits of one of the logic circuit groups A–D described with reference to FIG. 5A. For example, the alignment element 510 is shown receiving the ACC-BASED BIT 1, and the bits A1–A3. Similarly, the alignment element 512 is configured to receive the ACC-BASED BIT 2, and the bits B1–B3.

Each of the alignment elements 510, 512, 514, and 516 also receives two control bits. While in one embodiment the alignment elements in each reduction network (e.g., the alignment elements 510, 512, 514, and 516) receive the same two control bits, the level of individual control of the alignment elements is a design choice. In one embodiment, the alignment elements 510, 512, 514, and 516 are each configured to rotate their respective four inputs by either 0, 1, 2, or 3 positions, based on the two control bits, and generate three outputs, RA1–RA3, RB1–RB3, RC1–RC3, and RD1–RD3, which are grouped as ROT BIT GROUP 1, ROT BIT GROUP 2, ROT BIT GROUP 3, and ROT BIT GROUP 4, respectively (ROT is an acronym for "rotated"). The three outputs of each of the alignment elements 510, 512, 514, and 516 represents the rotated/shifted result of three of the four inputs to that alignment element. Thus, in one embodiment, the output bit RA1 of the alignment element 510, for example, may correspond to one of the ACC BASED BIT 1, A1, A2, or A3, depending on the rotation of input bits performed by the alignment element 510.

The alignment elements 510, 512, 514, and 516 are utilized in one embodiment to route/align data bits as they propagate through levels of logic in a reduction network. For example, in the creation of AND-OR logic functions, the level one logic circuit 404 may perform AND operations and the alignment circuit 406 may be utilized to align the result of the AND operations to OR logic elements (e.g., as may be contained in a level two logic circuit, as described below).

However, it should be understood that alternative embodiments of the invention may not include an alignment circuit. It should further be understood that there are several alternative embodiments of the alignment circuit 406 and the alignment elements 510, 512, 514, and 516. For example, shifters, multiplexers, and/or other devices may be utilized to implement the alignment elements 510, 512, 514, and 516. Furthermore, in alternative embodiments, each alignment element may be configured to receive/generate fewer or greater than the number of inputs, control signals, and/or outputs as described with reference to the exemplary embodiment of alignment elements illustrated in FIG. 5C. For example, in one embodiment, one or more alignment elements of the alignment circuit 406 does not receive an ACC-BASED BIT.

Optional Negation

Referring back to FIG. 4, the alignment circuit 406 is further coupled to an optional negation circuit 408. In one embodiment, the optional negation circuit selectively negates one or more of the outputs ROT BIT GROUP 1, ROT BIT GROUP 2, ROT BIT GROUP 3, and ROT BIT GROUP 4 generated by the alignment circuit 406. In one embodiment, the optional negation circuit contains a set of controlled negation elements (e.g., XOR gates) to selectively negate the output bits RA1–RA3, RB1–RB3, RC1–RC3, and RD1–RD3 generated by the alignment circuit 406 based on a control bit. While one embodiment is described in which the output bits of the alignment circuit 406 are selectively negated as a single group, the level of individual control of the negation elements is a design choice (i.e., additional control bits could be used to selective negate different sets of the bits output by the alignment circuit 406).

The optional negation circuit 408 may be utilized in an embodiment of the invention to facilitate certain logic functions, for example, through DeMorgan's law. It should be understood, however, that alternative embodiments of the reduction network 400 may not include the optional negation circuit 408.

Transportation

Referring again to FIG. 4, the bits output by the optional negation circuit (ROT BIT GROUPS 1–4, one or more of which may be negated) are provided to a transposition circuit 410. In one embodiment, the transposition circuit 410 includes a set of multiplexers configured to accept input, such the ROT BIT GROUPS 1–4, from a set of reduction networks in the reduction network bank 212. The set of multiplexers provide optional transposition (i.e., positional interchange) of rotate bit groups between the set of reduction networks in the reduction network bank 212. In one embodiment, the set of reduction networks whose rotate bit groups may be transposed includes adjacent reduction networks of the reduction network bank 212.

Figure 5D:
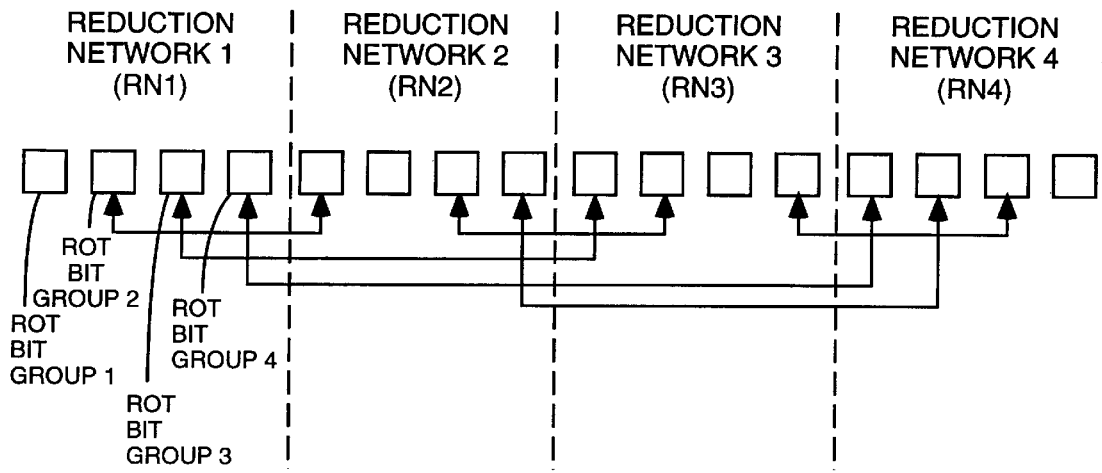
FIG. 5D is a data flow diagram illustrating a 4×4 matrix transposition of operands between four adjacent reduction networks according to one embodiment of the invention.
Figure 5E:
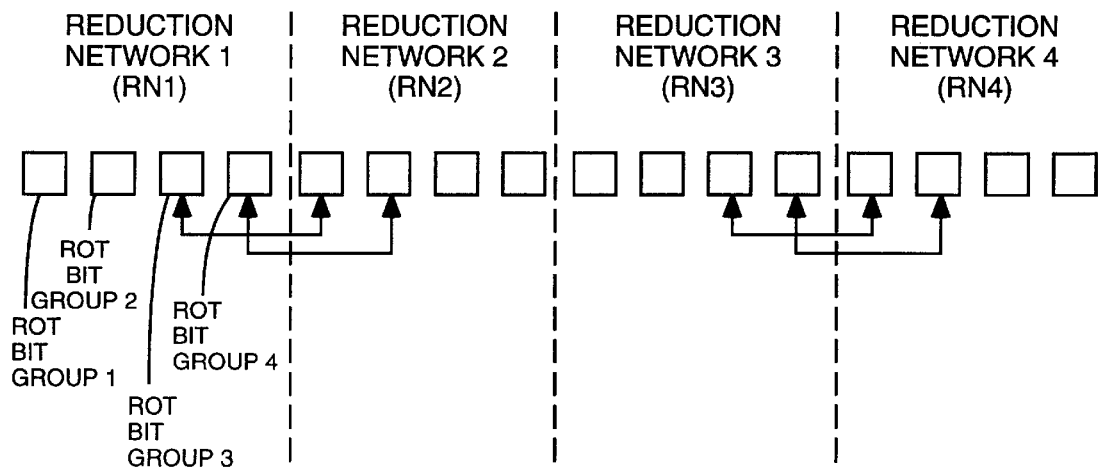
FIG. 5E is a data flow diagram illustrating a 2×2 matrix transposition of operands between four adjacent reduction networks according to one embodiment of the invention.

FIGS. 5D and 5E illustrate two exemplary transposition options that may each or both be implemented by the transposition circuit 410. FIG. 5D is a data flow diagram illustrating a 4×4 matrix transposition of ROT BIT GROUPs between four adjacent reduction networks. In FIG. 5D, the ROT BIT GROUPs 1–4 generated by an alignment circuit, for example, the alignment elements 510, 512, 514, and 516, are depicted by four squares for each of four reduction networks 1, 2, 3, and 4.

As shown by the arrows in FIG. 5D, the ROT BIT GROUPs of one reduction network, such as the reduction network 400, may be transposed (i.e., positionally interchanged) with the ROT BIT GROUPs of another reduction network. For example, as shown in FIG. 5D, the ROT BIT GROUP 2 of a reduction network 1 (RN1) may be transposed with the ROT BIT GROUP 1 of a reduction network 2 (RN2) (which may be adjacent to the reduction network 1 in a reduction network bank). Similarly, as indicated in FIG. 5D, the ROT BIT GROUP 3 of the reduction network 1 (RN1) may be transposed with the ROT BIT GROUP 1 of a reduction network 3 (RN3), while the ROT BIT GROUP 4 of the reduction network 1 (RN 1) may be transposed with the ROT BIT GROUP 1 of the reduction network 4 (RN4). Other transposition options are shown by the arrows in FIG. 5D.

FIG. 5E is a data flow diagram illustrating a 2×2 matrix transposition of ROT BIT GROUPs between four adjacent reduction networks. As described with reference to FIG. 5D, the ROT BIT GROUPs 1–4 generated by an alignment circuit, such as the alignment elements 510, 512, 514, and 516, are also depicted in FIG. 5E by four squares for each of four reduction networks 1, 2, 3, and 4. Similarly, arrows are shown in FIG. 5E to indicate the ROT BIT GROUPs interchanged between the reduction networks. For example, as illustrated by one of the arrows in FIG. 5E, the ROT BIT GROUP 3 of the reduction network 1 (RN1) is interchanged with the ROT BIT GROUP 1 of the reduction network 2 (RN2) (Note: In FIG. 5E, reduction networks 1, 2, 3, and 4 are respectively providing rows 1, 3, 2 and 4 of the matrix).

In a typical embodiment, one or more transpositions patterns would be chosen to allow positional interchange of ROT BIT GROUPs among a certain number of reduction networks, and these patterns would be repeated for all the reduction networks in the reduction network bank. For example, in an embodiment comprising 32 reduction networks, both 4×4 and 2×2 transposition patterns might be available for positional interchange among the 8 groups of 4 reduction networks, where the first group consists of {RN1, RN2, RN3, RN4}, the second group consists of {RN5, RN6, RN7, RN8}, and so on.

The number of control bits required depends on the number of transposition patterns chosen. The input width of the multiplexers required to effect transposition depends on both the number of transposition patterns chosen and the position within the group of reduction networks involved. For example, in an embodiment with 4×4 and 2×2 transposition patterns, one can refer to FIGS. 5D and 5E to see how many inputs are needed for each multiplexer. For ROT BIT GROUP 1 of reduction network 1, no multiplexer is needed, as neither transposition pattern interchanges it with another. For ROT BIT GROUP 2 of reduction network 1, a 2-input multiplexer is needed as part of the 4×4 transposition network; it will be steered by a bit that controls whether the 4×4 transposition is in effect or not for this group of 4 reduction networks. For ROT BIT GROUPs 3 and 4 of reduction network 1, two 2-input multiplexers are needed, one for the 4×4 transposition and one for the 2×2 transposition, each steered by a separate control bit. The pattern is not the same for the other reduction networks within the group of 4. For example, in reduction network 2, ROT BIT GROUP 1 requires two 2-input multiplexers, while ROT BIT GROUPs 2, 3, and 4 require a single 2-input multiplexer.

While two exemplary transposition options of the transposition circuit of FIG. 4 have been described, alternative embodiments may facilitate transposition of operands using several other transposition techniques. For example, the set of reduction networks between which transposition may be performed could be fewer or greater than four, as exemplified in the embodiments shown in FIGS. 5D and 5E. Furthermore, transposition schemes other than 2×2 matrix and/or 4×4 matrix may be performed in alternative embodiments. In certain alternative embodiments, ROT BIT GROUPs may be transposed within a reduction network. In other alternative embodiments, the transposition circuit 410 is not included in the reduction network 400.

While one embodiment is described in which optional negation follows rotation and in which transposition follows optional negation, alternative embodiment could rearrange the order of this circuitry. Thus, in an embodiment having alignment and transposition circuitry, the level two logic described below is said to receive data representing the output of the level one logic that has been "routed" to the level two logic via alignment and transposition circuitry, regardless of the order of the alignment and transposition circuitry.

Level Two Logic

Referring again to FIG. 4, the transposed and/or non-transposed ROT BIT GROUPS are provided by the transposition circuit 410 to a level two logic circuit 412, which in turn is coupled to an output selection circuit 414. The level two logic circuit 412 and the output selection circuit 414, according to one embodiment of the invention, are described below with reference to FIG. 5F.

Figure 5F:
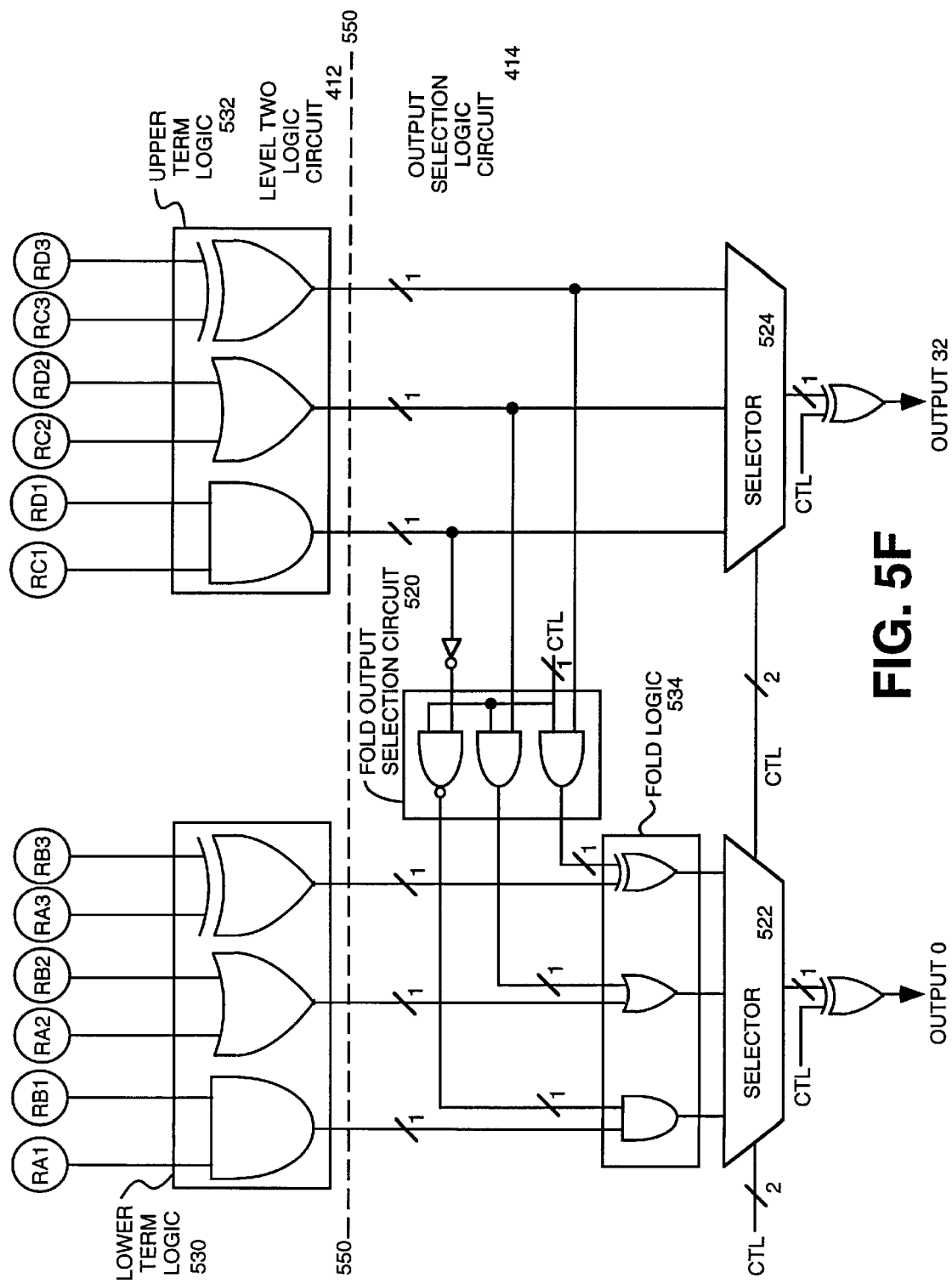
FIG. 5F is a schematic diagram illustrating the level two logic circuit 412 and the output selection circuit 414 of FIG. 4 according to one embodiment of the invention.

FIG. 5F is a schematic diagram illustrating the level two logic circuit 412 and the output selection circuit 414 according to one embodiment of the invention. In FIG. 5F, the level two logic circuit 412 and the output selection circuit 414 are respectively shown above and below the dashed line 550.

In the embodiment depicted in FIG. 5F, the level two logic circuit 412 comprises a set of logic element types similar to ones included in the level one logic circuit 404 described above. As shown, the level two logic circuit 412 includes a lower term logic 530 and an upper term logic 532, each comprising a two-input AND, OR, and XOR gate configured to receive adjacent ROT GROUP BITS. In one embodiment, each ROT GROUP BIT, such as the bit RA1 and/or RB1 shown coupled to the AND gate of the lower term logic 530, may represent a transposed (e.g., from another reduction network) and/or a negated one of the ROT GROUP BITs. On the other hand, one or more of the inputs to one or more of the AND, OR, and/or XOR logic elements of the level two logic circuit 412 may directly correspond (e.g., without transposition and/or negation) to the output of the alignment elements 510, 512, 514, and 516, described with reference to one embodiment of the alignment circuit 406.

While one embodiment is described in which the same logic is in both the level one and two logic circuits, the logic in each level need not be the same and is a design choice. Furthermore, while one embodiment is shown have two levels of logic, alternative embodiments could include additional levels of alignment, negation, transposition, and/or logic.

Output Selection

The three bits output from the upper term logic 532 of the level two logic circuit 412 are fed into a selector 524, as well as a fold output selection circuit 520. The selector 524, based on two control bits, selects one of the results of the upper term logic 532 as an OUTPUT 32. The fold output selection circuit 520 may be included in every reduction network in the reduction network bank 212 to "unfold" the result of the level two logic circuit 412 by one. As such, the fold output selection circuit 520 of the reduction network 400 receives the same control bit as other fold output selection circuits that may be included in other reduction networks. Of course, the granularity of control of the folding circuitry is a design choice.

As shown in FIG. 5F, the three bit result of the fold output selection circuit 520 are coupled, with corresponding results of the lower term logic 530, to a fold logic 534 which includes an AND, and OR, and an XOR logic element. In this manner, the control bit applied to the fold output selection circuit 520 is used to selectively pass the results of the upper term logic 532 to corresponding gates that combine the corresponding results of the lower and upper term logic 530 and 532.

While one embodiment of the folding circuitry is described, alternative embodiments can use different circuitry. For example, an alternative embodiment provides a set of two 2-to-1 multiplexors, each of which receives one output from the lower term logic 530 and the appropriate logical combination of that output with the corresponding output from the upper term logic 532 (e.g., one 2-to-1 multiplexor receives the output of the AND gate in lower term logic 530 and the logical AND of that output with the output of the AND gate in the upper term logic 532).

The results of the fold logic 534 are coupled to a selector 522, which selects, based on two control bits, one of the results of the fold logic 534 to output as OUTPUT 0. While distinct control bits are used to control the selectors 522 and 524 in the embodiment shown, the level of individual selection of output is a design choice.

In one embodiment, the output of selectors 522 and 524 are respectively coupled to XOR gates which provide conditional negation of the reduction network outputs. These are shown with distinct control bits for each output, however the level of individual selection of conditional negation of outputs is a design choice.

It should be appreciated that alternative embodiments of the invention may not include fold circuitry (e.g., the fold output selection circuit 520, the fold logic 534, etc.), the level two logic circuit 412, and/or the selective negation.

Output

Figure 6:
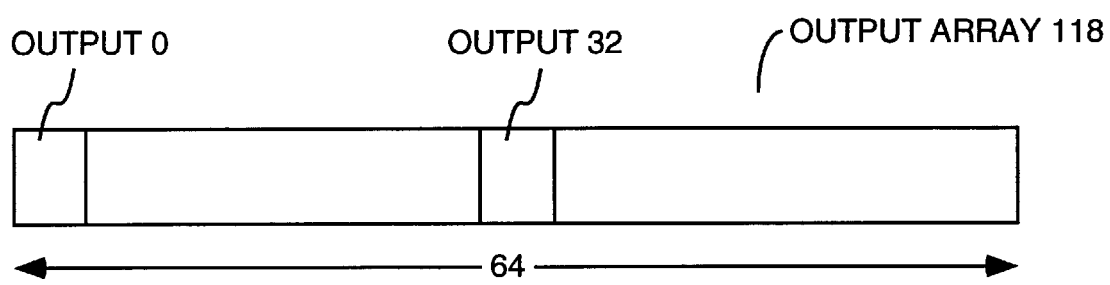
FIG. 6 is a diagram illustrating an output array according to one embodiment of the invention.

Referring now to FIG. 6, a 64 output array 118 according to one embodiment of the invention is shown. The output array 118 illustrates the relative positions of the OUTPUT 0 and OUTPUT 32 result bits generated by the output selection circuit 414 of a first reduction network (e.g. RN1) of the reduction network bank 212. The output array 118 may represent data that is asserted on one or more lines (e.g., on a bus) and/or stored in a storage area, such as a register, accumulator, etc.

Exemplary Logic Operational of an Embodiment of the Reduction Network Bank

In one embodiment, the reduction network bank 212 having 32 reduction networks receiving 48 selectively rearrangeable/negateable inputs bits may be utilized to perform one or more of the following exemplary logic operations:

1. 32 1-level functions of 1 to 48 inputs over Boolean AND, OR, XOR or their negations;
2. 32 2-level functions, with 4 first-level terms of 1 to 12 inputs over Boolean AND, OR, XOR or their negations, and 1 second-level term over Boolean AND, OR, XOR or their negations, with no restrictions as to which functions are used in the first and second level, and with each of the 4 first-level terms being provided by a distinct subset of the 48 outputs (including conditional negation) of the rearrangement circuit 202 when considered as 4 groups of 12 bits;
3. 32 2-level functions, with the same conditions as option 2 except that for functions in positions 0 mod 4, all 4 of the first-level operands may be provided by the first group of the 4 groups of 12 rearrangement circuit (e.g., MUX) outputs, and for functions in positions 1 mod 4, all 4 of the first-level operands may be provided by the second group of the 4 groups of 12 rearrangement circuit outputs, and so on;
4. 32 2-level functions, with the same conditions as option 2 except that for functions in even positions, 2 of the first-level operands may be provided by the first group of the 4 groups of rearrangement circuit outputs and the other 2 of the first-level operands may be provided by the second group of the 4 groups of 12 rearrangement circuit outputs, and for functions in odd positions, 2 of the first-level operands may be provided by the third group of the 4 groups of 12 rearrangement circuit outputs, and the other 2 of the first-level operands may be provided by the fourth group of the 4 groups of 12 rearrangement circuit outputs;
5. 64 1-level functions of 1 to 24 inputs over AND, OR, XOR or their negations;
6. 64 2-level functions, with 2 first-level terms of 1 to 12 inputs over Boolean AND, OR, XOR or their negations, and 1 second-level term over Boolean AND OR, XOR or their negations, with no restrictions as to which functions are used in the first and second level, wherein 32 of the functions may have the 2 first level operands provided by the first and second of the 4 groups of 12 rearrangement circuit outputs, and wherein the other 32 of the functions may have the 2 first-level operands provided by the third and fourth of the 4 groups of 12 rearrangement circuit outputs;
7. 64 2-level functions, with the same conditions as option 6 except that for functions in positions 0 mod 4, both of the first-level operands may be provided by the first group of the 4 groups of 12 rearrangement circuit outputs, and for functions in positions 1 mod 4, both of the first-level operands may be provided by the second group of the 4 groups of 12 rearrangement circuit outputs, and so on; and
8. 64 2-level functions, with the same conditions as option 6 except that for the first 32 functions in even positions, both of the first-level operands may be provided by the first group of the 4 groups of 12 rearrangement circuit outputs, and for the first 32 functions in odd positions, both of the first-level operands may be provided by the second group of the 4 groups of 12 rearrangement circuit outputs; and for the second 32 functions in even positions, both of the first-level operands may be provided by the third group of the 4 groups of 12 rearrangement circuit outputs, and for the second 32 functions in odd positions, both of the first-level operands may be provided by the fourth group of the 4 groups of 12 rearrangement circuit outputs.

Post Processing

The final stage in the programmable logic datapath 114 is the post processing unit 214, which may be included in one embodiment of the invention to perform post-processing. As such, the post processing unit 214 may include a predetermined set of logic (e.g., Boolean logic) functions that may be computed over the output of the reduction network bank 212. In an alternative embodiment, the post processing unit 214 may implemented as/within a device coupled to a field programmable datapath according to the present invention (e.g., as a co-processing integrated circuit, a CPU, etc.).

In one embodiment, the post processing unit 214 may be configured to perform eight zero detection functions over each of the eight 8-bit fields of the 64-bit output array 118. The zero detection of an 8-bit field can be done with a single 8-input NOR gate; the output of this gate will be 1 just in case all 8 inputs are 0. The eight zero detection functions, accomplished with 8 NOR gates, may be further combined (e.g., using an AND operation) to detect zero across 16-bit fields, 32-bit fields, and/or the entire 64-bit output array 118.

The post processing unit 214 may be further configured, in one embodiment, to encode as a binary number the position of the least significant and/or most significant logical one or zero bit among the 64-bit output array 118. Similarly, the post processing unit 214 may be configured to encode the number of ones and/or zeros in the 64-bit output array 118 and/or a subset thereof.

The post processing unit 214 may be configured to perform a barrel rotate function, which rotates the 64-bit output array, with the rotate amount controlled either by control/configuration bits of a DCV provided by the decoding logic unit 112 and/or from a register that can be set by an output array generated by a previous datapath cycle.

The final result of the programmable logic datapath 114 may be obtained by multiplexing the reducing network bank output(s) with the output(s) of post processing unit 214. As described, the control vectors controlling the programmable logic datapath 114 may be changed dynamically to perform a variety of logic functions.

It should be understood that there are several alternatives to the exemplary embodiment of the field programmable datapath that has been described. For example, alternative embodiment may support various input, output, and control bit widths. Additionally, alternative embodiments of the programmable logic datapath may include various numbers and combinations of logic level circuits, selective negation circuits, transposition circuits, reduction networks, etc. Furthermore, several types and combinations of logic elements (e.g., AND, OR, XOR, NAND, NOR, NOT, etc.) may be utilized in alternative embodiments of the programmable logic datapath of the present invention.

Exemplary Applications of the Programmable Logic Datapath

The present invention may be configured to perform one or more of a variety of applications. Furthermore, the one or more functions may be dynamically (e.g., on a cycle-by-cycle basis) programmed into the programmable logic datapath 114.

As a first example, the programmable logic datapath 114 may configured to perform Content Addressable Memory (CAM) operations. A CAM system element is typically implemented as a specialized circuit element, either on a separate chip or as a block of a larger VLSI chip. CAM is used, for example, in network bridging and routing equipment to provide relatively rapid look up of the address of incoming packets in a table of active addresses. The logical function of a CAM is that of a set of wide AND gates with conditional negation at each input. Each pattern to be matched is "programmed" by negating those inputs corresponding to zeros in the pattern and leaving positive those corresponding to one. The inputs are then combined by a logical AND operation, and the result is a one when the input matches the pattern.

In one embodiment, the programmable logic datapath 114 may be configured to compare up to 32 such patterns in a cycle, each pattern having at least 24 inputs, and possibly more if the patterns have relatively few zeros or relatively few ones. For shorter patterns, the programmable logic datapath 114 may be configured to compare up to 64 patterns in a cycle, while for longer patterns, it may be configured to compare fewer patterns in a cycle.

A second function that may be performed by the programmable logic datapath of the present invention is parity sums. Some problems involve computing parities over subsets of input bits. For example, systems for transmission of ASCII characters may add a "parity bit" which is the XOR sum of the 7 bits in each character, which allows any single transmission error to be detected. More sophisticated systems for error detection and correction are well known. For example, CRC-32 is a relatively widely used algorithm for computing a 32-bit checksum over a set of data that allows many error patterns to be detected. Reed-Solomon codes are even more sophisticated coding schemes that allow errors to be detected and corrected. Both the encoding and the checking step of CRC-32 can be viewed as XOR sums over certain subsets of the input bits together with state bits that are accumulated to form a 32-bit remainder. The same is true for other cyclic redundancy checks, such as CRC-16 and the HEC byte in ATM cell headers. Similarly, Reed-Solomon encoding, as well as many of the steps of Reed-Solomon decoding, may be viewed as computing XOR sums over certain subsets of the input bits together with accumulated state bits. Since the XOR sums of such encoding/decoding schemes are 1-level logic functions, programmable logic datapath 114 can compute up to 32 distinct such functions over 1 to 48 inputs per cycle.

For example, the programmable logic datapath 114 can compute CRC-32 over 16 input bits in a single cycle, while updating a 32-bit state register (e.g., contained in the register bank 104 or 106) for the next 16 bits. Such a technique is an extension of techniques described in T. Pei and C. Zukowski, "High-Speed Parallel CRC Circuits in VLSI", IEEE Trans Comm., V40, no. 4, April 1992, pp 653–657. The programmable logic datapath 114 can also compute other CRCs: 32 input bits at a time of CRC-16, up to 38 input bits at a time of CRC-10, all of the ATM Header Error Check (which is essentially a CRC-8 over 32 data bits). Furthermore, the programmable logic datapath 114 can compute syndromes of Reed-Solomon codes and perform other Reed-Solomon decoding functions over arbitrary Galois Fields of the form $GF(2^n)$.

The preceding examples use 1-level logic functions over many inputs. In hardware design practice, it is very common to use 2-level logic functions as well, with AND-OR logic being the most well established. Complex hardware designs may use more than 2 levels of logic. The programmable logic datapath 114 can perform 2 levels of logic in a single cycle, or more than 2 levels of logic by using multiple cycles. As a third example, the programmable logic datapath 114 can perform a 2-level Boolean logic calculation that is generally considered to be relatively difficult: the "S" functions of the Data Encryption Standard, or DES. The "S" functions, commonly known as "Sboxes" are 8 carefully chosen, random-appearing functions, each mapping 6 inputs to 4 outputs. As such, SBoxes can be considered as 32 single-output Boolean functions of 6 inputs. As reported in J. Robinson and C. Yeh, "A Method for Modulo-2 Minimization", IEEE Trans Comp, v C-31. no 8. August 1982, pp. 800–801, each of the 32 Boolean functions making up the Sboxes requires an average of 27.88 terms in AND-OR logic form. It is shown in the above-referenced paper (Robinson et al.) that using AND-XOR logic with optimal assignment of positive and negative literals to the AND terms results in an average complexity of 12.6 terms. Since the programmable logic datapath 114 can handle 4 terms at a time on 32 outputs, a worst case complexity of 16 terms may be expected, which can be handled in 4 cycles of the programmable logic datapath 114 according to one of the described embodiments.

While several exemplary functions that may be performed by the programmable logic datapath of the present invention have been described, it should be understood that the invention is not limited the functions described.

Exemplary Applications of the Disclosed Programmable Logic Device

Versions of the field programmable device 100 may be used in conjunction with other devices and systems. For example, certain embodiments may include one or more versions of the field programmable device 100 tightly coupled with one or more computer processors (CPUs) and I/O circuitry on a single semiconductor chip (referred to herein as a programmable system chip).

Figure 7A:
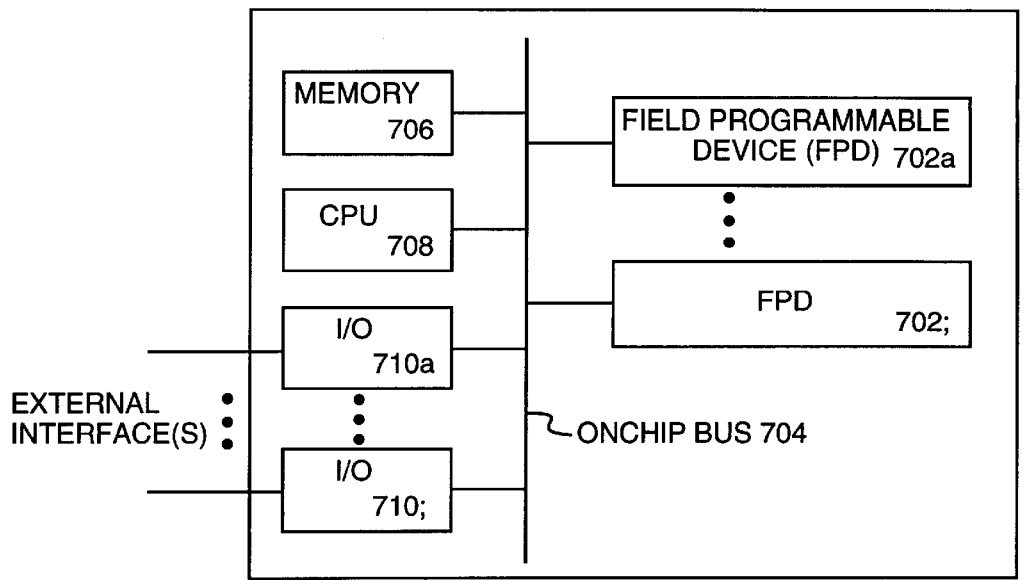
FIG. 7A is a block diagram illustrating an exemplary programmable system chip 700 according to one embodiment of the invention.

FIG. 7A is a block diagram illustrating an exemplary programmable system chip 700 according to one embodiment of the invention. FIG. 7A shows the programmable system chip 700 incorporating one or more field programmable devices 702a–i, a CPU 708, an onchip memory 706 (e.g., SRAM, ROM, RAM, etc.), and one or more blocks of I/O circuitry 710a–j. The onchip elements communicate via an onchip bus 704, which may have any number of data and address wires, but which could conveniently include 32 or 64 data bits and 32 address bits. Such a configuration permits high bandwidth among each of the onchip elements. In an alternative embodiment, one or more of the field programmable devices 702a–i could have dedicated I/O paths, either in addition to or instead of communicating using the onchip bus.

Figure 7B:
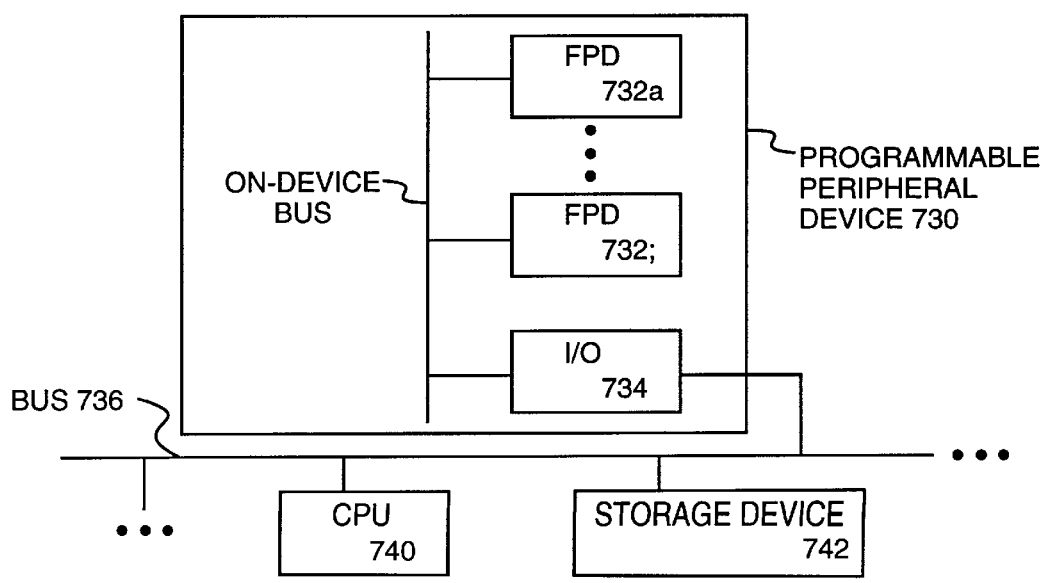
FIG. 7B is a block diagram illustrating an exemplary computer system including a programmable peripheral device 730 according to one embodiment of the invention.

As another example, certain system embodiments may include one or more versions of the field programmable device 100 contained in a "programmable peripheral device" coupled via bus-oriented I/O circuitry to a bus and thereby to a CPU on another chip. FIG. 7B is a block diagram illustrating an exemplary computer system including a programmable peripheral device 730 according to one embodiment of the invention. FIG. 7B shows the programmable peripheral device 730, in which one or more field programmable devices 732a–i are coupled via bus-oriented I/O circuitry 734 to a bus 736 and thereby to a CPU 740 (implemented on one or more other chips). Additionally, a storage device 742 is coupled to the bus 736. The programmable peripheral device 730 may be permanently or non-permanently attached to the bus 736. For example, the programmable peripheral device 730 may be a removable card (e.g., an ISA card, a PCI card, a PCMCIA card, etc.). In addition, the components of the programmable peripheral device 730 may be implemented on multiple chips or on a single chip.

While a single CPU and programmable peripheral device are shown in FIG. 7B, additional CPUs and/or programmable peripheral devices can be added. The storage device 742 represents one or more mechanisms for storing data. For example, the storage device 742 may include read only memory (ROM), random access memory (RAM), magnetic disk storage media, optical storage media, flash memory devices, and/or other machine-readable media. The bus 736 represents one or more busses (e.g., PCI, ISA, X-Bus, EISA, VESA, etc.) and bridges (also termed as bus controllers).

A number of user input/output devices, such as a keyboard, a display and a network, may also be coupled to the bus 736, but are not necessary parts of the invention. As used herein, the term machine readable medium includes the signals (e.g., carrier ways) received via a network.

In the embodiments shown in FIGS. 7A or 7B or their variants, the field programmable devices are configured to operate as co-processing devices under the control of the CPU(s). As such, the field programmable devices perform various functions, based on data inputs and/or control signals received from the one or more CPUs. The CPU(s) configures the field programmable devices (as necessary) by initializing the memories contained in control logic unit (if present) and decoding logic unit (if present). Thereafter, data is transferred across the onchip bus with signals from the input array to the control logic unit and/or decoder to cause the device to read and process the signals on the data and/or address pins of the input array. Similarly, a field programmable device can initiate a data transfer to another field programmable device, the CPU, or other onchip block, by placing data and address values in the output array and raising a signal that initiates the bus transfer.

Versions of the programmable system chip 700 could be advantageously used in applications such as networking, digital video and audio, complex test and measurement tasks, wireless communications, color printing and graphics rendering, hardware simulation, etc. The most desirable types of I/O blocks will vary somewhat depending on the application. For example, in some applications, it would be desirable to have direct interfaces to analog-to-digital and/or digital-to-analog converters. In others, interfaces to a general purpose bus such as PCI are desirable. In still other applications, specific types of interface standards have been developed, such as interface standards for ATM or Fast Ethernet in networking, or interface standards for digital video in multimedia production, for example. To be optimally useful in these application areas, the programmable system chip 700 must support these I/O interfaces.

In all cases, the CPU 708 would be responsible not only for the configuration of the field programmable devices 100, but for all the ongoing control of a complex nature. This includes, for example, the higher layers of network processing, such as receiving and responding to SNMP network management messages. The CPU's ongoing processing may include various kinds of interactions with the field programmable devices. For example, the CPU may request readout of certain registers in the register bank of a certain field programmable device where network statistics have been configured to be stored. As another example, the CPU may determine that a previously unrecognized network address should henceforth be recognized; as a result, it may program the subset selection circuit of a previously unused reduction network bank in the programmable logic datapath to recognize the pattern of bits corresponding to the new network address. As a third example, in a digital video decompression application, a field programmable device might recognize and signal to the CPU the part of a compressed bit stream representing higher level syntactic information to be parsed by the CPU and used to set up control circuitry and register values in the field programmable device.

In all of these examples, the potential for high bandwidth and low latency communication between the CPU and any of the registers within the field programmable devices is a useful feature that is often difficult to provide in prior art designs.

A version of the programmable peripheral device 730 could be advantageously used in reconfigurable computing applications, wherein a CPU 740 sets up the a field programmable chip 730 as a co-processor to perform a specific function and arranges for input data to be provided and output data to be routed appropriately across the bus 736. The advantage of this arrangement is that at a later time a different function could be provided by suitable reconfiguration without changing any of the hardware. The reconfigurable functions might come, for example, from any of the application areas enumerated above.

Another Embodiment of the Field Programmable Device

While several embodiments of the invention have been described, additional embodiments of the invention are described below. These additional embodiments of the invention will be described with reference to the previously described figures. Of course, different aspects of the previously described embodiments and the following can be combined.

Selector Unit

In particular, while the selector unit 108 of FIG. 1 can be implemented in a number of different ways, in one embodiment of the invention the selector unit 108 is composed of multiplexers whose output forms the input to the programmable logic datapath 114 and/or the programmable arithmetic datapath 116. The multiplexers of the selector unit 108 are coupled to select data from different sources, such as the register bank 104, the register bank 106, the input array 102, the output of the programmable logic datapath 114, and the output of the programmable arithmetic datapath 116 (several embodiments of the programmable arithmetic datapath are described in non-provisional application Ser. No. 08/953,766, filed Oct. 17, 1997, entitled "A RECONFIGURABLE ARITHMETIC DATAPATH," to Curtis Abbott; which is a continuation of provisional application No. 60/057,156, filed Aug. 28, 1997; which are hereby incorporated by reference). For example, the selector unit in one alternative embodiment of the invention is coupled to receive data from the register banks and the outputs from the datapaths, but not from the input array (rather, data provided on the input array is stored in the register bank(s) before being processed).

Figure 8:
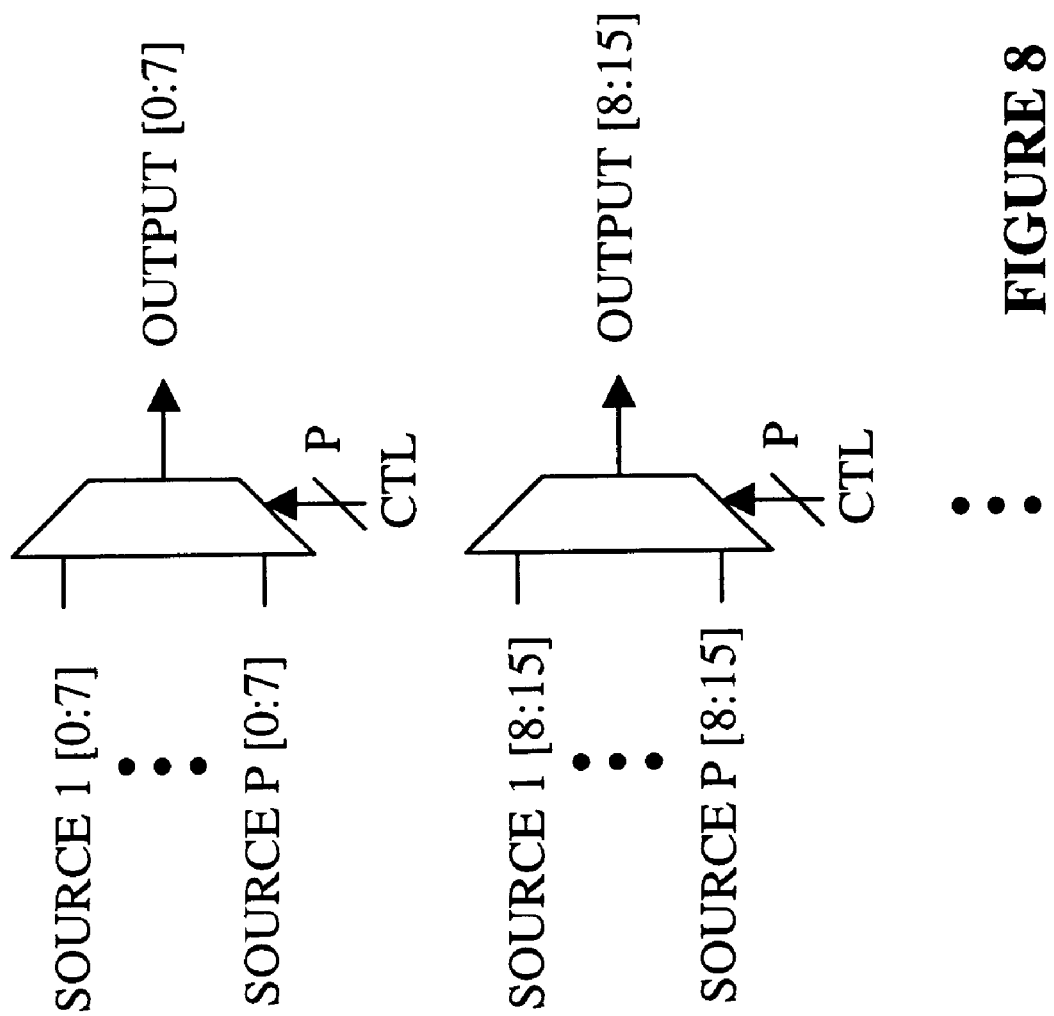
FIG. 8 is a block diagram illustrating a selector unit of FIG. 1.

While different embodiments can implement the selector unit 108 to select data from the sources according to different granularities, in one embodiment of the invention illustrated in FIG. 8 data is selected on a byte-by-byte basis. FIG. 8 illustrates the selector unit of FIG. 1 according to one embodiment of the invention. FIG. 8 shows k byte-wise multiplexers, where k times 8 equals the number of bits output, and where P is the number of different sources. For example, assuming that the selector unit receives 64 bits from 4 different sources and provides 64 bits, the selector unit is composed of 8 byte-wise multiplexers.

In one embodiment of the invention that processes 64 bits, two control fields control the byte-wise multiplexers, an upper field and a lower field. The upper and lower control fields respectively control the upper and lower 32 input bits to the selector unit. Each of the datapaths both provide 64 output bits; the lower and upper 32 of these output bits are respectively fed to the lower and upper input bits of the selector unit. Similarly, the register banks have two ports; port 1 feeds the lower 32 input bits to the selector unit, while port 2 feeds the upper.

Programmable Logic Datapath

One alternative embodiment of the programmable logic datapath receives and operates on 64 bits rather than 48 bits as previously described with reference to FIG. 2. Thus, the rearrangement circuit and the selective field negation circuit of this alternative embodiment each receive and output 64 bits instead of 48. In addition, there are 64 reduction networks in the reduction network bank of this alternative embodiment. While the remainder of this section will assume such a 64 bit system, it is understood that the number of bits used is a design choice and that the various implementation alternatives described in previous sections apply equally here.

The programmable logic datapath is a single-operand function unit that performs general-purpose Boolean logic and routing computations. The single-operand nature of the programmable logic datapath is somewhat extended by the previously described byte-wise selector unit.

This alternative embodiment of the invention implements the rearrangement circuit and the selective field negation circuit on a bit-wise basis. In other words, the rearrangement arrangement circuit provides a bit-wise crossbar switch composed of sixty-four 64-to-1 multiplexers that allow for arbitrary permutation and copying of the input bits. This independent control requires: 1) for the rearrangement circuit, six bits per multiplexer times 64 multiplexers for a total of 384 control bits per instruction; and 2) for the selective negation circuit, 64 control bits.

Taken together, the bit-wise rearrangement circuit and selective field negation circuit allow for placement of positive or negative literals from any input bit position at any result bit position. These 64 positive/negative literals are input to the reduction network bank of the programmable logic datapath, and therefore are referred to as reduction network inputs.

An Embodiment of the Reduction Network Bank

Figure 9:
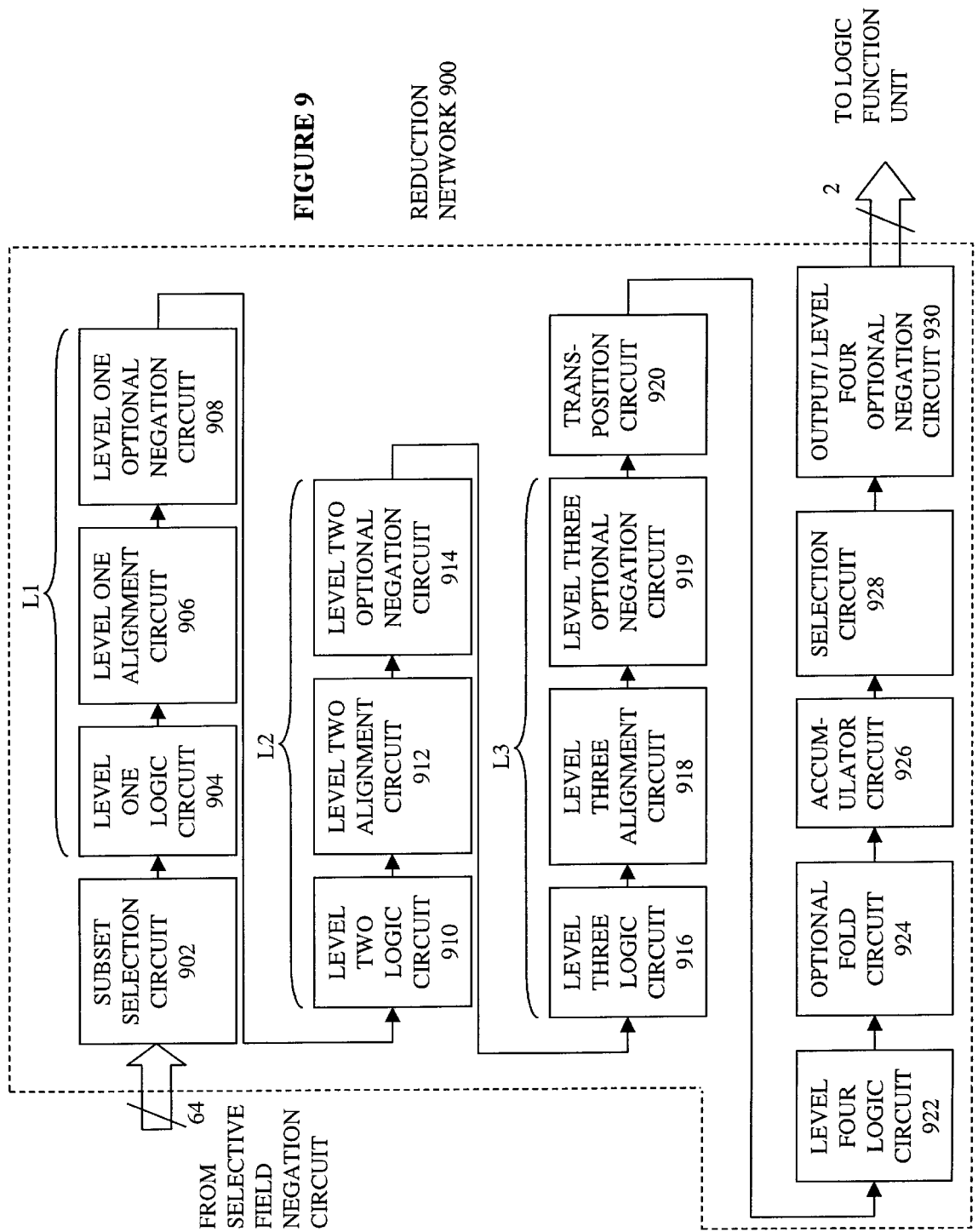
FIG. 9 is a block diagram illustrating a reduction network in the reduction network bank according to an alternative embodiment of the invention.

FIG. 9 is a block diagram illustrating one reduction network 900 in the reduction network bank according to an alternative embodiment of the invention. In contrast to the reduction network of FIG. 4, the reduction network of FIG. 9 has four logic levels.

FIG. 9 shows a subset selection circuit 902, three logic levels (L1–L3), a transposition circuit 920, a level four logic circuit 922, an optional fold circuit 924, an accumulator circuit 926, and an output/level four optional negation circuit 930. Each of the first three logic levels (L1–L3) is made up of generally the same circuits: a logic circuit, an alignment circuit, and an optional negation circuit (further described below). In the embodiment of FIG. 9, the fourth logic level is intermixed with the output selection logic circuit. In particular, the fourth logic level is comprised of the level four logic circuit 922 and the output/level four optional negation circuit 930. Thus, the fourth logic level is similar to L1–3, except that it does not include an alignment circuit. The output selection logic circuit is comprised of the optional fold circuit 924, the selection circuit 928, and the output/level four optional negation circuit 930.

Figure 10:
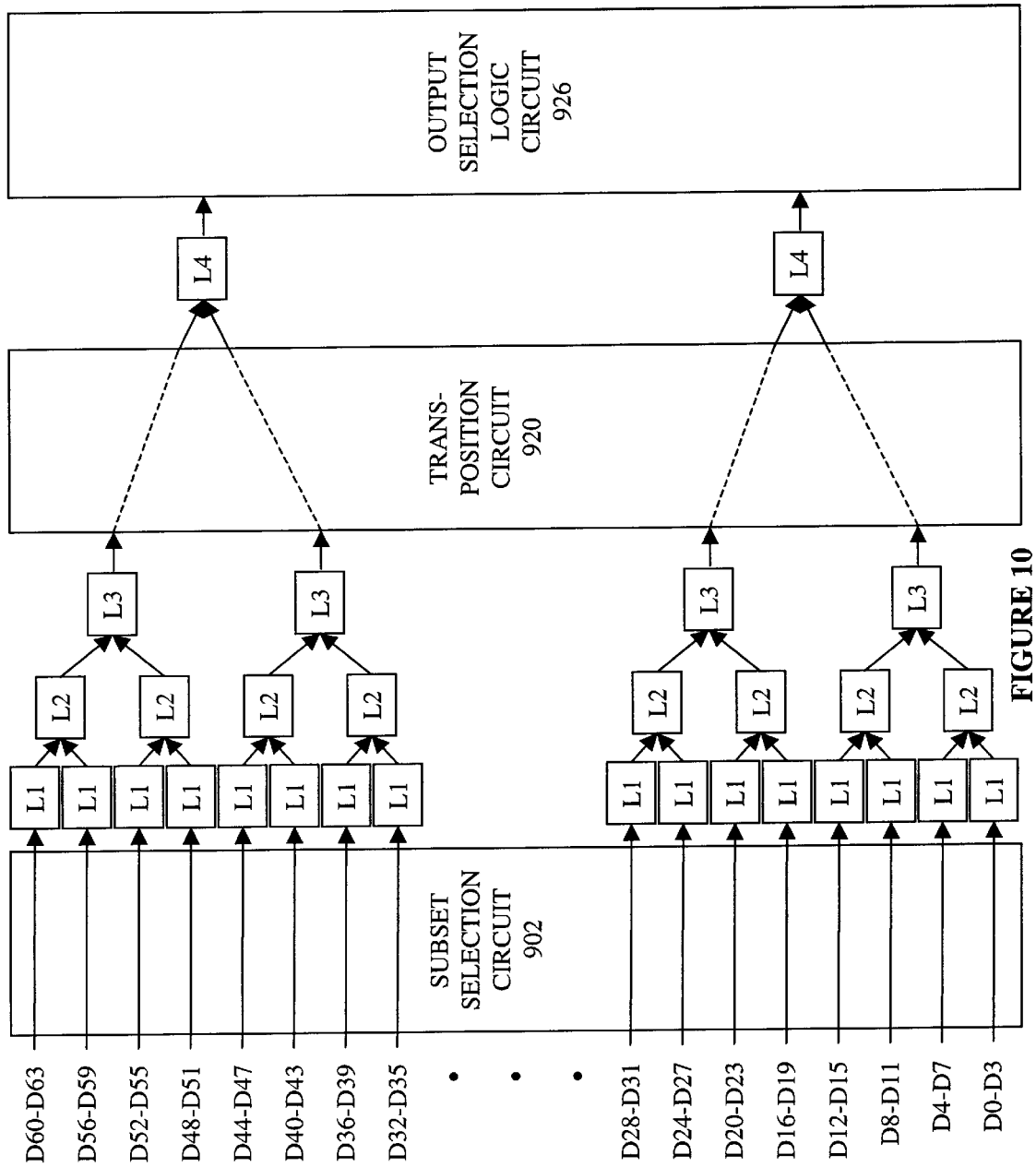
FIG. 10 is a block diagram illustrating a different representation of the reduction network of FIG. 9 according to one embodiment of the invention.

FIG. 10 is a block diagram illustrating a different representation of the reduction network of FIG. 9 according to one embodiment of the invention. FIG. 10 illustrates that the L1 logic level performs a four-to-one reduction, whereas the L2–L4 logic levels each perform two-to-one reductions. Alternative implementations can include more or less logic levels, as well as provide for different amounts of reduction at any given level.

Figure 11:
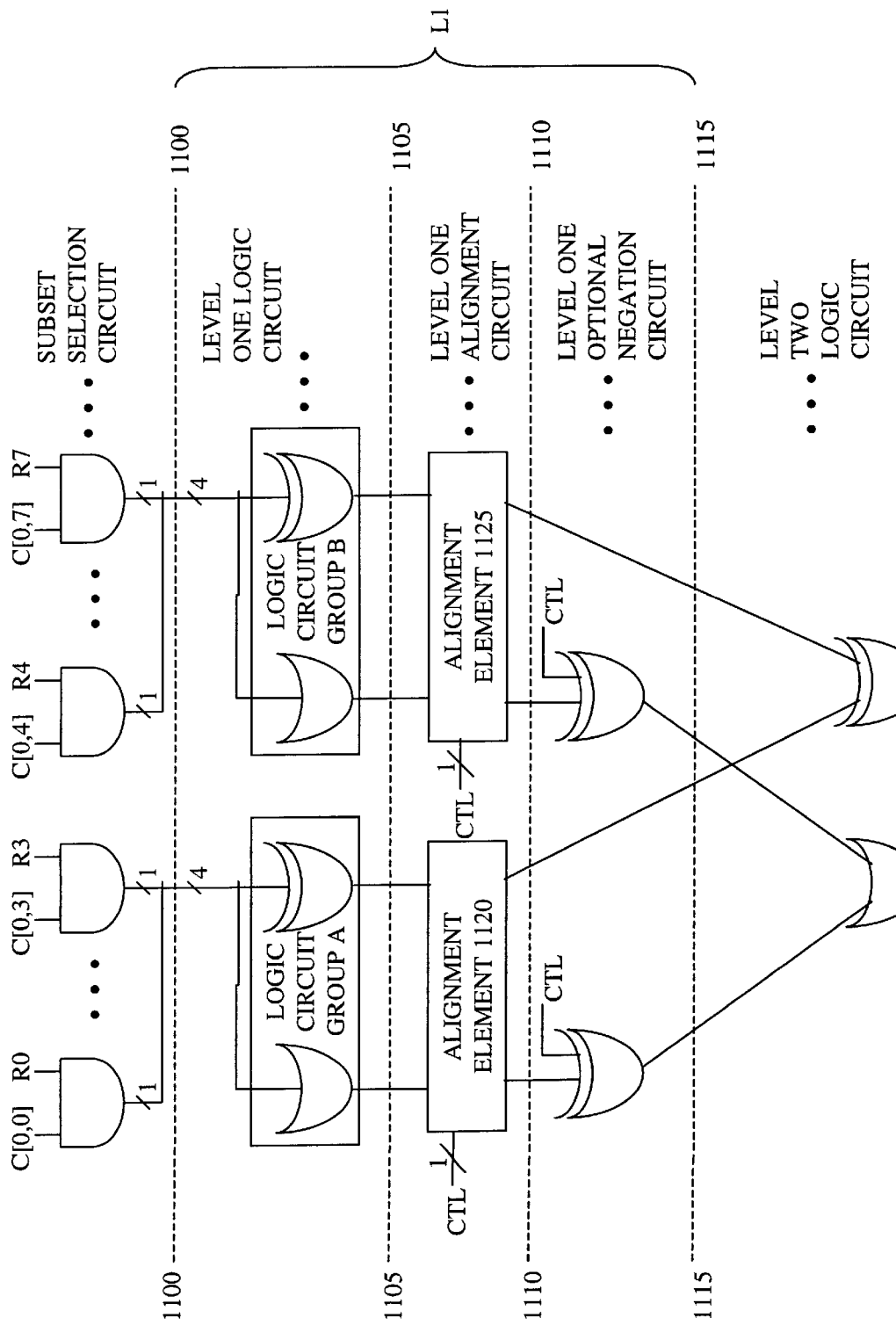
FIG. 11 is schematic diagram illustrating parts of a subset selection circuit.

FIG. 11 is a schematic diagram illustrating parts of the subset selection circuit 902, the L1 logic level, and the level two logic circuit 910 of FIG. 9 according to one embodiment of the invention. Table 1 below identifies the circuitry with respect to the dashed lines in FIG. 11.

TABLE 1

| Dashed Lines | Circuitry From |
|---|---|
| Above 1100 | Subset Selection Circuit 902 |
| Between 1100 and 1105 | Level One Logic Circuit 904 |
| Between 1105 and 1110 | Level One Alignment Circuit 906 |
| Between 1110 and 1115 | Level One Optional Negation Circuit 908 |
| Below 1115 | Level Two Logic Circuit 910 |

The exemplary implementation of the level one logic circuit 804 shown in FIG. 11 operates on groups of four bits using OR and XOR gates, as opposed to the exemplary implementation of the level one logic circuit 404 shown in FIG. 5A which operates on groups of twelve bits using AND, OR and XOR gates. As a result, the subset selection circuit of the embodiment of FIG. 11 includes sixteen groups of AND gates, wherein each of the sixteen groups includes four AND gates. Each AND gate in the subset selection circuit in FIG. 11 is coupled to receive a control bit $C[i,j]$ and an input bit Rn, where i indicates one of the 64 reduction networks 0–63, j represents one of the 64 gate control bits 0–63, and Rn represents one of the bits 0–63 input to the reduction network.

The result of each group of AND gates from the subset selection circuit is provided to a different logic circuit group of the level one logic circuit 904. For example, FIG. 11 shows that the outputs of the first two groups of four AND gates are respectively provided to logic circuit groups A and B. Each of the logic circuit groups separately ORs and XORs its inputs; and accordingly provides a pair of output bits.

Each pair of output bits is provided to an alignment element of the level one alignment circuit 906. For example, in FIG. 1 the output bits from the logic circuit groups A and B are respectively provided to an alignment element 1120 and 1125. In contrast to the alignment elements of FIG. 5C that receive four data inputs, the alignment elements of FIG. 11 receive two data inputs. Since the alignment elements 1120 and 1125 are operating on only two inputs bits, they can each be implemented to optionally switch with one bit control; as opposed to the rotation logic of the alignment elements in FIG. 5C that each require 2 control bits. The term "OR output" refers to the output that provides the result of the OR operation in the level one logic circuit when no switch is performed by an alignment element.

As illustrated in FIG. 11, the OR output from each of the alignment elements is provided to optional negation circuitry, whereas the other output (the "XOR output") is passed through to the level two logic circuit. The combination of the OR/XOR logic and the optional negation of the OR output of the alignment elements allows the combination of AND, OR, and XOR logic to be achieved through DeMorgan's Law. Of course, supporting AND, OR, and XOR operations through actual gates or DeMorgan's Law, as well as the number of operation types performed, is a design choice.

In the embodiment shown in FIGS. 10 and 11, the adjacent alignment elements in the level one alignment circuit 906 are paired. The outputs (after passing through the level one optional negation circuit 908) from each pair of adjacent alignment elements is combined in a logic circuit group of the level two logic circuit 910.

The L2 and L3 logic levels follows generally the same structure as the L1 logic level. The output from the L3 logic level is provided to the transposition circuit 920.

As used herein, a literal is a positive or negative instance of a (single bit) variable, while a term is a combination of literals by one of the standard Boolean functions (e.g., AND, OR, XOR). In operation, the selective field negation circuit (e.g., see FIG. 2) outside the reduction network bank allows positive and negative literals to be created. In contrast, the optional negation circuits of L1–L3 allow application of DeMorgan's Law, so that any AND or OR term can be created.

For example, suppose it is desired to generate the term $d_0 \sim d_2 \sim d_5 d_6$, wherein $\sim$ denotes negation, concatenation denotes AND, and d is an input to the rearrangement circuit. By DeMorgan's Law, this is equivalent to $\sim(\sim d_0 + \sim d_2 + d_5 + \sim d_6)$, wherein + denotes OR. This result can be achieved by:

1) Ensuring that $d_0$ and $d_6$ are negated in the selective field negation circuit
2) Ensuring that $d_2$ and $d_5$ are left positive
3) Setting the first eight AND gates in the subset selection circuit to 10100110 (counting left to right with bit 0 on the left)
4) Setting the level one alignment and negation circuits to neither switch nor negate
5) Setting the level two alignment and negation circuits to negate but not switch At this point, the desired output is available at the OR output of the level two alignment element in the level two alignment circuit. By setting and subsetting the AND gates as described above, the desired literals are applied to the term being computed. By setting the level one alignment and negation circuits to pass the inputs unchanged, the four-input OR gates from both logic circuit groups A and B (see FIG. 11) are turned into an eight-input OR gate (and similarly for the XOR gates). By setting the level two alignment and negation circuits as described above, we apply DeMorgan's Law.

To continue this example, suppose it is desired to compute the sum of the term above $(d_0 \sim d_2 \sim d_5 d_6)$ and $\sim d_9 d_{12} d_{13} \sim d_{14} d_{15}$. Using reasoning similar to the above example, the second term can be computed as $\sim(d_9 + \sim d_{12} + \sim d_{13} + d_{14} + \sim d_{15})$. As such, the OR gate of the L3 logic level combines the terms to create the desired function (the level three optional negation circuit will not be set to negate).

Next, assume that the desired function is $(d_0 \sim d_2 \sim d_5 d_6) \oplus \sim d_9 d_{12} d_{13} \sim d_{14} d_{15}$ (i.e., the same terms, but combined by an XOR operation). To achieve this, the two alignment/optional negation elements that compute the AND terms must be set to switch, so the input coming from the OR gate goes out to the XOR gate at the next logic level, and vice versa (note that the OR-XOR signal is the one of interest, but the reduction networks also computes the XOR of the terms combined by the OR operation—i.e., the function $d_0 \oplus d_2 \oplus d_5 \oplus d_6 + \sim d_9 \oplus d_{12} \oplus d_{13} \oplus d_{14} \oplus d_{15}$ where some of negations have been removed because this is logically equivalent under XOR).

Recall that in the illustrated embodiment there is no optional negation on the XOR output of an alignment element. Therefore it is irrelevant in this case how the negation controls of the optional negation circuit are set. These negation controls are missing because there is no loss of expression in leaving them out. In the example at hand, it was desired to compute $\sim(\sim d_0 + \sim d_2 + d_5 + \sim d_6)$ and $\sim(d_9 + \sim d_{12} + \sim d_{13} + d_{14} + \sim d_{15})$ at the term level. Since these are now being combined with an XOR operation, negating two input terms is equivalent to negating zero of them (more generally, negating any even number of terms is equivalent to negating any other even number of terms; and likewise for odd numbers of terms). If one of the input terms needs to be negated, this can be achieved by negating the output of the XOR operation, which can be done either in the next logic level or in the output selection logic circuit (further described below).

Table 2 below shows the number of literals and terms with respect to the L1–L3 logic levels according to the described embodiment.

TABLE 2

| Level | Literals | Terms |
|---|---|---|
| L1 | 4 | 16 |
| L2 | 8 | 8 |
| L3 | 16 | 4 |

Figure 12:
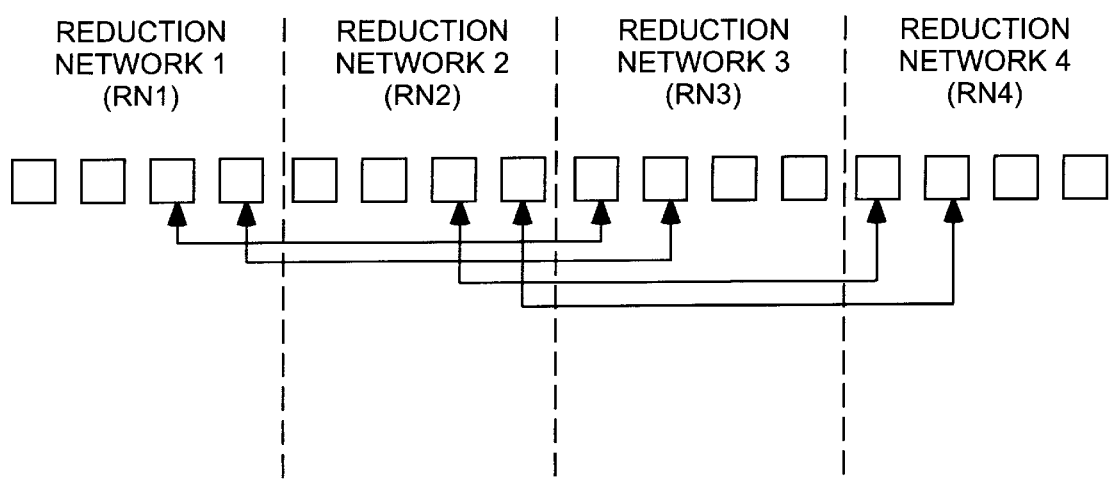
FIG. 12 illustrates another exemplary transposition option.

FIG. 12 illustrates another exemplary transposition option. FIG. 12 follows the same labeling as FIGS. 5D and 5E. Similar to FIG. 5E, FIG. 12 shows a 2×2 matrix transposition between four adjacent reduction networks. However, while in FIG. 5E reduction networks 1, 2, 3, and 4 are respectively providing rows 1, 3, 2 and 4 of the matrix; in FIG. 12 reduction networks 1, 2, 3, and 4 are respectively providing rows 1, 2, 3 and 4 of the matrix.

Figure 13:
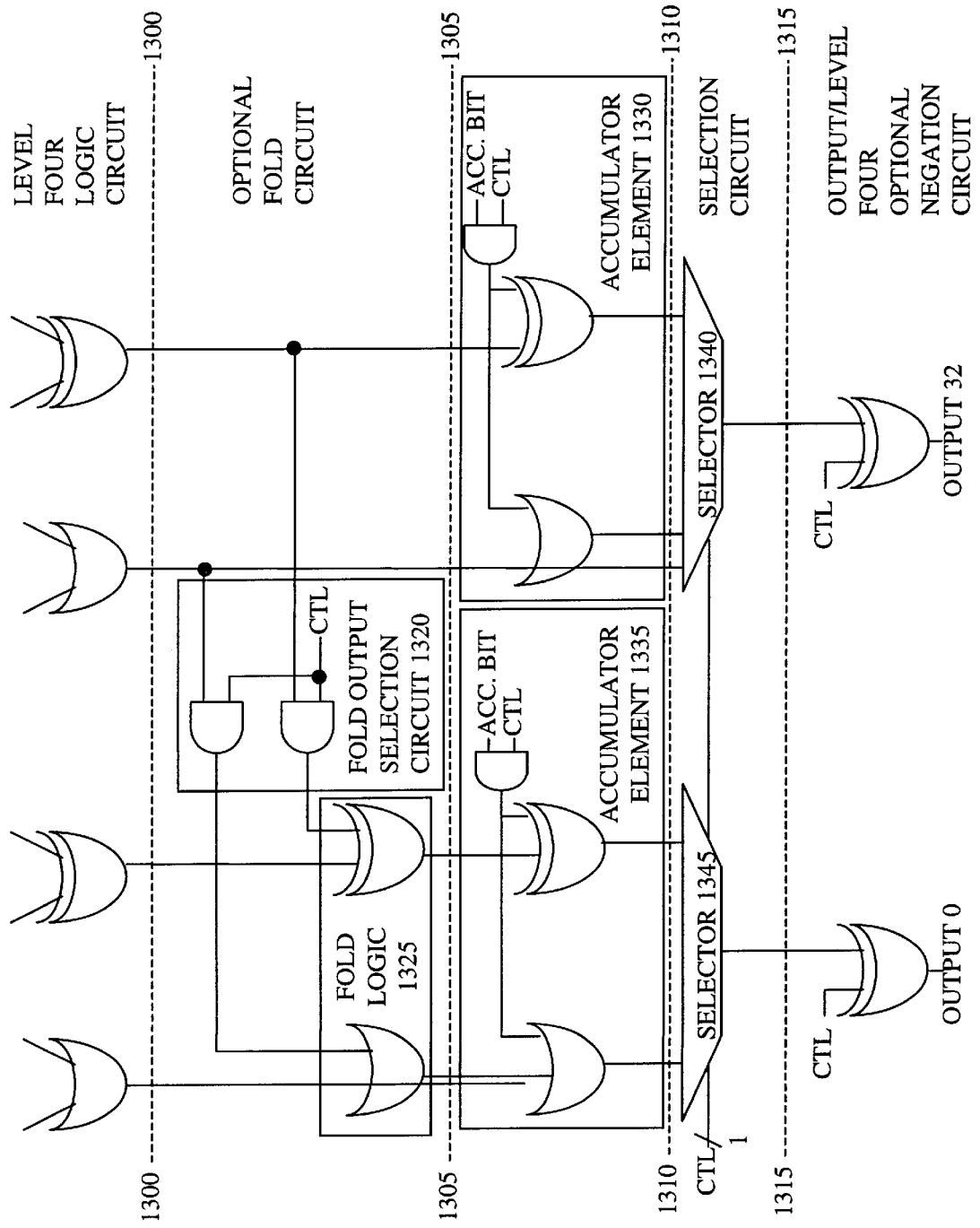
FIG. 13 is a schematic diagram illustrating parts of a L4 logic level and the output selection logic circuit of FIG. 9 according to one embodiment of the invention.

FIG. 13 is a schematic diagram illustrating parts of the L4 logic level and the output selection logic circuit of FIG. 9 according to one embodiment of the invention. Table 3 below labels the circuitry with respect to the dashed lines in FIG. 13.

TABLE 3

| Dashed Lines | Circuitry From |
| --- | --- |
| Above 1300 | Level Four Logic Circuit 922 |
| Between 1300 and 1305 | Optional Fold Circuit |
| Between 1305 and 1310 | Accumulator |
| Between 1310 and 1315 | Selection Circuit |
| Below 1315 | Output/Level Four Optional Negation Circuit |

In FIG. 13, a fold output selection circuit 1320 and a fold logic 1325 make up the optional fold circuit and operate in a manner similar to the optional fold circuit of FIG. 5F, with the exception that OR and XOR gates are used instead of AND, OR, and XOR gates. The pair of output bits from the upper term of the level four logic circuit are fed into a fold output selection circuit 1320 and an accumulator element 1335. The output of the fold output selection circuit 1320 is provided to an accumulator element 1335 along with the pair of output bits from the lower term of the level four logic circuit. The output of the fold logic 1325 is fed to an accumulator element 1335.

Each of the accumulator elements allows the output of the programmable logic datapath from the previous cycle to be logically combined with the output of the current cycle. In the embodiment of FIG. 13, each of the accumulator elements 1330 and 1335 includes: 1) an AND gate for receiving an accumulation bit and a control bit for selectively controlling whether an accumulation is performed; and 2) OR and XOR gates for logically combining the pair of output bits received from the optional fold circuit with the accumulation bit.

The pair of bits output by each of the accumulator elements 1330 and 1335 are respectively provided to a selector 1340 and 1345. The selectors 1340 and 1345 provide a similar function to that of the selectors 524 and 522, with the exception that the selectors 1340 and 1345 receive only two inputs and therefore require only one control bit. The outputs of the selectors 1340 and 1345 are provided to output/level four optional negation circuitry similar to the outputs of selectors 522 and 524.

In summary, each reduction network can perform single or multilevel logic operations. For example, each reduction network may be thought of as a single level 64-bit wide logic gate that can be controlled to be either in an AND gate, an OR gate, or an XOR gate. Any subset of the 64 reduction network input bits may be fed to each of these gates in a given reduction network. Abstractly, then, a given reduction network can compute any single term from 64 input literals over AND, OR, and XOR (note: AND and OR can be obtained from a single reduction network of OR gates, plus appropriate negation facilities to take advantage of the DeMorgan's law). As another example, each reduction network can perform 2 or more level logic functions, such as AND-OR, AND-XOR, AND-OR-AND, etc. With two-level logic, each reduction network can independently trade-off the number of terms summed against the number of literals in each term. Independently, one can change the sources of the literals for terms so that each reduction network computes multiple terms from the same set of input literals or all terms from different sets of input literals. With regard to the folding logic, each reduction network may be unfolded by two, so that alternative way to think of the reduction network bank is as 64 reduction network's each having 32 input literals.

The reduction network bank provides 32 or 64 pairs of bits (depending on whether the programmable logic datapath is configured on a particular cycle as 32 folded reduction networks of 64 inputs each, or as 64 unfolded reduction networks of 32 inputs each)—one bit of each pair is the AND/OR tree result, and the other is the XOR result. These bits may be accumulated by (OR or XOR) with the previous output. The programmable logic datapath output is obtained by selecting either the AND/OR tree or the XOR tree.

In one embodiment of the invention consistent with FIGS. 9–13, table 4 shows the control bits used.

TABLE 4

| Circuitry Being Controled | Number of Control Bits |
| --- | --- |
| Byte-wise Selector Unit selecting 64 bits optionally from four different sources) | 16 |
| 64-bit cross bar Rearragenment Circuit | 384 |
| 64-bit bit-wise Subset Selection Circuit | 2048 |
| L1–L3 | 128 each (64 for alignment and 64 for optional negation) |
| Transposition | 16 |
| Optional Fold | 1 |
| Optional Accumulate | 64 |
| Output Selection (e.g., selectors 1340 and 1345) | 64 |
| Optional Negation of the Output | 64 |

Alternatives Embodiments

While the invention has been described in terms of several embodiments, those skilled in the art will recognize that the invention is not limited to the embodiments described. In particular, the invention can be practiced in several alternative embodiments that provide a dynamic field programmable logic datapath.

Therefore, it should be understood that the method and apparatus of the invention can be practiced with modification and alteration within the spirit and scope of the appended claims. The description is thus to be regarded as illustrative instead of limiting on the invention.

What is claimed is:

1. A field programmable logic device comprising:

a plurality of sources each providing an output;

a selector unit to separately select for each part of its output the corresponding part of the output from one of said plurality of sources; and a programmable logic datapath coupled to said selector unit including, a rearrangement circuit coupled to receive said output of said selector unit;

a selective field negation circuit coupled to said rearrangement circuit; and a plurality of reduction networks each coupled to receive the outputs of said selective field negation circuit and each including a series of logic levels coupled together to selectively reduce those outputs using XOR, OR, and selective negation circuitry down to one bit.

2. The field programmable logic device of claim 1, wherein said rearrangement circuit at least one of selects and re-orders the bits of said output of said selector unit.

3. The field programmable logic device of claim 1 wherein each of said plurality of reduction networks also includes a subset selection circuit to selectively pass the outputs of said selective field negation circuit to the first in the series of logic levels.

4. The field programmable logic device of claim 1 further comprising:
   a decoder; and
   a memory coupled to said programmable logic datapath and said selector unit and addressable by said decoder, said memory for storing or having stored therein a plurality of sets of control signals, each set of control signals when applied to said programmable logic datapath causing said programmable logic datapath to perform a different function.

5. The field programmable logic device of claim 1 wherein said plurality of sources includes an input array and a register bank.

6. The field programmable logic device of claim 1, wherein each of said plurality of reduction networks also includes:
   a transposition circuit to selectively interchange with another of said plurality of reduction networks data being routed from one of said logic levels to the next.

7. The field programmable logic device of claim 1, wherein the parts selected by said selector unit are bytes.

8. The field programmable logic device of claim 7 wherein each of said plurality of reduction networks also includes a subset selection circuit to selectively pass the outputs of said selective field negation circuit to the first in the series of logic levels.

9. An apparatus comprising:
   a programmable logic datapath having a plurality of inputs, said programmable logic datapath including a plurality of reduction networks, each of said plurality of reduction networks including,
      at least three logic levels coupled in series, wherein two dynamic reduction paths are provided through said logic levels that each reduce data provided at the plurality of inputs to one bit, each of the logic levels logically combines one or more mutually exclusive groups of data on one of the dynamic reduction paths by XOR operations, each of the logic levels logically combines corresponding groups of data on the other of the dynamic reduction paths by OR operations, each of the logic levels separately selectively switches the XOR and OR outputs in each corresponding group, each logic level also separately selectively negates the output in each corresponding group along one of the dynamic reduction paths.

10. The apparatus of claim 9 wherein said programmable logic datapath further comprises:
   a rearrangement circuit coupled to the plurality of inputs; and
   a selective field negation circuit coupled to said rearrangement circuit and each of said plurality of reduction networks.

11. The apparatus of claim 9, wherein said programmable logic datapath further comprises a rearrangement circuit to selectively couple data provided at the plurality of inputs to different ones of a plurality of rearrangement circuit outputs, said plurality of reduction networks coupled to said rearrangement circuit outputs.

12. The apparatus of claim 11, wherein said programmable logic datapath further comprises a negation circuit coupled between the rearrangement circuit and the plurality of reduction networks to conditionally complement data provided at different ones of the plurality of rearrangement circuit outputs.

13. The apparatus of claim 9 wherein each of said plurality of reduction networks also includes a subset selection circuit coupled to selectively pass the provided data to both of the dynamic reduction paths.

14. The apparatus of claim 9 further comprising:
   a decoder; and
   a memory coupled to said programmable logic datapath and addressable by said decoder, said memory for storing or having stored therein a plurality of sets of control signals, each set of control signals when applied to said programmable logic datapath causing said programmable logic datapath to perform a different function.

15. The apparatus of claim 9, wherein each of said plurality of reduction networks also includes:
   a transposition circuit to selectively interchange with another reduction network data being routed from one of said logic levels to the next according to the dynamic reduction paths.

16. The apparatus of claim 9, further comprising:
   a plurality of sources each providing an output; and
   a selector unit coupled to said plurality of sources and said plurality of inputs to said programmable logic datapath, said selector unit to separately select for each part of its output the corresponding part of the output from one of the plurality of sources.

17. The apparatus of claim 16 wherein said plurality of sources includes an input array and a register bank.

18. The apparatus of claim 16, wherein the parts selected by said selector unit are bytes.

19. A programmable logic datapath comprising:
   a plurality of inputs; and
   a plurality of reduction networks, each of said plurality of reduction networks including,
      a first and second level one logic circuits each coupled to receive a first and second copy of data provided at a different set of said plurality of inputs, each level one logic circuit respectively performing an XOR and OR logic operation on said first and second copy to respectively provide a first and second logic output;
      an alignment and negation circuit, coupled to said first and second outputs of said first and second level one logic circuits, to selectively provide different combinations of one output from each of said first and second level one logic circuits at each of a first and second alignment output, as well as selectively negate at least one of the values provided on one of the first and second alignment outputs; and
      a level two logic circuit having a first and second input respectively coupled to said first and second outputs of said alignment and negation circuit, said level two logic circuit respectively performing an XOR and OR operation on data received at said first and second inputs.

20. The programmable logic datapath of claim 19 further comprising:
   a plurality of level one logic circuits and corresponding alignment and negation circuits; and
   a plurality of level two logic circuits coupled in similar manner to pairs of said plurality of level one logic circuits.

21. The programmable logic datapath of claim 20 further comprising:

a plurality of alignment and negation circuits coupled to said level two logic circuit and said plurality of level two logic circuits according to mutually exclusive pairs; and one or more additional levels of logic circuits and corresponding alignment and negation circuits coupled in similar series to said plurality of alignment and negation circuits coupled to said level two logic circuit and said plurality of level two logic circuits.

22. The programmable logic datapath of claim 21 further comprising:

a final level of logic circuit and corresponding negation circuit coupled in similar manner to provide one bit representing the reduction of the data provided at the plurality of inputs.

23. The programmable logic datapath of claim 21 further comprising:

a transposition circuit to selectively interchange data being routed between one level of logic circuits and corresponding alignment and negation circuits and an adjacent level of logic circuits in different ones of said plurality of reduction networks.

24. The programmable logic datapath of claim 19, wherein at least one of said plurality of reduction networks further includes:

a subset selection circuit coupled to said plurality of inputs to selectively pass data provided at different inputs of each of said sets of inputs respectively to said first and second level one logic circuits.

25. The programmable logic datapath of claim 19 further comprising:

a rearrangement circuit coupled to said plurality of inputs; and a selective field negation circuit coupled to said rearrangement circuit and each of said plurality of reduction networks.

26. An apparatus comprising:

a plurality of sources each providing an output;

a selector unit to separately select for each part of its output the corresponding part of the output from one of said plurality of sources; and a programmable logic datapath coupled to said selector unit including, a plurality of reduction networks each including, at least three logic levels coupled together in series including, a first logic level to group its inputs into mutually exclusive groups, separately perform a first and second logic operations on separate copies of the inputs within each group, and optionally switch the combined results within each group before provision to the next logic level, and each of the remaining logic levels to combine the groups provided to it from the previous logic level into mutually exclusive super groups, perform the first and second logic operations respectively on the first and second optionally switched combined results of the groups, and optionally switch the inputs in each of the groups before provision to the next logic level.

27. The apparatus of claim 26 wherein said programmable logic datapath further comprises:

a rearrangement circuit coupled to receive the output from said selector unit; and a selective field negation circuit coupled to said rearrangement circuit and each of said plurality of reduction networks.

28. The apparatus of claim 26, wherein said programmable logic datapath further comprises a rearrangement circuit to selectively couple the output of said selector unit to different ones of a plurality of rearrangement circuit outputs, said first logic level in each of said plurality of reduction networks coupled to said plurality of rearrangement circuit outputs.

29. The apparatus of claim 28, wherein said programmable logic datapath further comprises a negation circuit coupled between the rearrangement circuit and the plurality of reduction networks to separately selectively complement data on different ones of the plurality of rearrangement circuit outputs.

30. The apparatus of claim 26 wherein each of said plurality of reduction networks also includes a subset selection circuit coupled provide the inputs to said first logic level.

31. The apparatus of claim 26 further comprising:

a decoder; and a memory coupled to said programmable logic datapath and said selector unit and addressable by said decoder, said memory for storing or having stored therein a plurality of sets of control signals, each set of control signals when applied to said programmable logic datapath causing said programmable logic datapath to perform a different function.

32. The apparatus of claim 26 wherein said plurality of sources includes an input array and a register bank.

33. The apparatus of claim 26, wherein each of said plurality of reduction networks also includes:

a transposition circuit to selectively interchange with another reduction network data being routed from one of said logic levels to the next.

34. The apparatus of claim 26, wherein the first and second logic operations of at least one logic level in each of said plurality of reduction networks are XOR and OR operations along with selective negation according to DeMorgan's Law.

35. The apparatus of claim 26, wherein the parts selected by said selector unit are bytes.

36. A machine-implemented method comprising:

receiving an output from each of a plurality of sources;

separately selecting for each part of a current output a corresponding part of the output from one of said plurality of sources, wherein the bits of said current output form a plurality of mutually exclusive groups; and performing the following in each of a plurality of reduction networks, duplicating said current output to form a first and second version of each group, reducing the first and second version of each group through logic operations to provide for each group a first and second output that are selectively switched and one of which is optionally negated, where the groups form mutually exclusive sets, reducing the first and second output of each group within each set through logic operations to provide for each set a first and second output that are selectively switched and one of which is optionally negated, where the sets form mutually exclusive supersets, and reducing the first and second output of each set within each superset through logic operations to provide for each superset a first and second output that are selectively switched and one of which is optionally negated.

37. The machine-implemented method of claim 36, wherein each of said plurality of reduction networks also performs the following:
   selectively removing different sets of bits in the current output before said duplicating.

38. The machine-implemented method of claim 36, wherein each of said plurality of reduction networks also perform the following:
   continuing reducing in like manner until the current output and the duplicate have each been reduced to a single bit.

39. The machine-implemented method of claim 38, wherein said continuing reducing includes interchanging between different ones said plurality of reduction networks data generated by one of said reducings and the next reducing.

40. The machine-implemented method of claim 38 further comprising:
   for each of the plurality of reduction networks, selecting between the single bits to provide a bit in a collective output of the plurality of reduction networks.

41. The machine-implemented method of claim 36 further comprising:
   rearranging different bits in the current output before said performing.

42. The machine-implemented method of claim 41, wherein said rearranging includes replacing certain bits of said current output with a duplicate of other bits of said current output.

43. The machine-implemented method of claim 36 further comprising:
   negating different bits of said current output before said performing.

44. A machine-implemented method comprising:
   receiving a plurality of inputs, wherein said plurality of inputs form a plurality of mutually exclusive groups;
   duplicating said plurality of inputs to form a first and second version of each group;
   reducing the first and second version of each group to provide a first and second output for each group by performing the following for each group,
      logically combining the inputs within the first version of that group with an XOR operation;
      logically combining the inputs within the second version of that group with an OR operation;
      selectively switching the result of the logic operation on the first and second version in that group between the first and second outputs for that group; and
   reducing the first and second output of each group to provide a first and second output for each set, where the groups form mutually exclusive sets, by performing the following for each set,
      logically combining the first output for the groups within that set with an XOR operation;
      logically combining the second output for the groups within that set with an OR operation;
      selectively switching the result of the logic operation on the first and second output for that set between the first and second outputs for that set.

45. The machine-implemented method of claim 44, wherein said receiving said plurality of inputs further comprises:
   selectively blocking different sets of the plurality of inputs.

46. The machine-implemented method of claim 44, wherein said selectively switching includes selectively negating at least on of the first and second outputs.

47. The machine-implemented method of claim 44 further comprising:
   continuing reducing in like manner until the plurality of inputs and the duplicate of the plurality of inputs have each been reduced to a single bit.

48. The machine-implemented method of claim 47, wherein said method is separately performed on two separately controlled reduction networks, and wherein said continuing reducing includes interchanging between different ones of said plurality of reduction networks data generated by one of said reducings and the next.

49. The machine-implemented method of claim 44, wherein said receiving further comprises:
   rearranging different ones of said plurality of inputs.

50. The machine-implemented method of claim 44, wherein said rearranging includes replacing certain ones of said plurality of inputs with a duplicate of other ones of said plurality of inputs.

51. The machine-implemented method of claim 44, wherein said receiving said plurality of inputs further comprises:
   negating different ones of said plurality of inputs.

* * * * *